(12) United States Patent
Kasai et al.

(10) Patent No.: US 9,380,380 B2
(45) Date of Patent: Jun. 28, 2016

(54) ACOUSTIC TRANSDUCER AND INTERFACE CIRCUIT

(71) Applicants: Omron Corporation, Kyoto-shi (JP); STMICROELECTRONICS S.R.L., Agrate Brianza (IT)

(72) Inventors: Takashi Kasai, Kustasu (JP); Shobu Sato, Ikoma (JP); Yuki Uchida, Otsu (JP); Igino Padovani, Novate Milanese (IT); Filippo David, Milan (IT); Sebastiano Conti, Mistretta (IT); Martino Zerbini, Lodi (IT); Luca Molinari, Piacenza (IT)

(73) Assignees: STMicroelectronics S.r.l., Agrate Brianza (IT); Omron Corporation, Kyoto-shi (JP)

( * ) Notice: Subject to any disclaimer, the term of this patent is extended or adjusted under 35 U.S.C. 154(b) by 298 days.

(21) Appl. No.: 13/936,110

(22) Filed: Jul. 5, 2013

(65) Prior Publication Data

US 2014/0010374 A1 Jan. 9, 2014

Related U.S. Application Data

(63) Continuation-in-part of application No. PCT/JP2011/079843, filed on Dec. 22, 2011.

(30) Foreign Application Priority Data

Jan. 7, 2011 (JP) .................................. 2011-002313
Nov. 14, 2012 (IT) ............................. TO2012A0987

(51) Int. Cl.
*H04R 5/00* (2006.01)
*H04R 3/00* (2006.01)
(Continued)

(52) U.S. Cl.
CPC ................ *H04R 3/00* (2013.01); *H04R 19/005* (2013.01); *H04R 19/016* (2013.01); *H04R 31/00* (2013.01); *H04R 1/086* (2013.01)

(58) Field of Classification Search
CPC .... H04R 3/005; H04R 19/005; H04R 25/407; H04R 3/00; H04R 31/00; H04R 1/086

USPC ................................ 381/56, 57, 122, 119, 26
See application file for complete search history.

(56) References Cited

U.S. PATENT DOCUMENTS 3,588,382 A 6/1971 Reedyk
3,875,349 A 4/1975 Ruegg
(Continued)

FOREIGN PATENT DOCUMENTS

EP 1385324 A1 1/2004
FR 2884101 A1 10/2006
(Continued)

OTHER PUBLICATIONS

Chinese Office Action dated May 27, 2015, for corresponding CN Application No. 201180064105.8 with English translation, 16 pages.
(Continued)

*Primary Examiner* — Vivian Chin
*Assistant Examiner* — Ammar Hamid
(74) *Attorney, Agent, or Firm* — Seed IP Law Group PLLC

(57) ABSTRACT

The present disclosure is directed to an acoustic transducer configured to detect a sound wave according to changes in capacitances between a vibrating electrode and a fixed electrode. At least one of the vibrating electrode and the fixed electrode being divided into a plurality of divided electrodes, and the plurality of divided electrodes outputting electrical signals. The disclosure includes a digital interface circuit coupled to the divided electrodes. The circuit includes a recombination stage, which supplies a mixed signal by combining the first digital processed signal and the second digital processed signal with a respective weight that is a function of a first level value of the first processed signal. An output stage is included, which supplies, selectively and alternatively, a first processed signal, a second processed signal, or a mixed signal.

17 Claims, 26 Drawing Sheets

(51) Int. Cl.
  *H04R 19/00* (2006.01)
  *H04R 19/01* (2006.01)
  *H04R 31/00* (2006.01)
  *H04R 1/08* (2006.01)

(56) References Cited

U.S. PATENT DOCUMENTS

| | | |
|---|---|---|
| 4,887,300 A | 12/1989 | Erling |
| 5,388,163 A | 2/1995 | Elko et al. |
| 5,452,268 A | 9/1995 | Bernstein |
| 5,517,683 A | 5/1996 | Collett et al. |
| 5,886,656 A | 3/1999 | Feste et al. |
| 5,982,709 A | 11/1999 | Ladabaum et al. |
| 6,101,258 A | 8/2000 | Killion et al. |
| 6,271,780 B1 | 8/2001 | Gong et al. |
| 6,449,593 B1 | 9/2002 | Valve |
| 6,535,460 B2 | 3/2003 | Loeppert et al. |
| 6,640,643 B2 | 11/2003 | Ishio et al. |
| 6,731,767 B1 | 5/2004 | Blamey et al. |
| 6,873,709 B2 | 3/2005 | Hou |
| 6,882,734 B2 | 4/2005 | Watson et al. |
| 6,944,474 B2 | 9/2005 | Rader et al. |
| 6,950,528 B2 | 9/2005 | Fischer |
| 7,003,127 B1 | 2/2006 | Sjursen et al. |
| 7,016,508 B1 | 3/2006 | Phelps |
| 7,146,016 B2 | 12/2006 | Pedersen |
| 7,170,847 B2 | 1/2007 | De Jong et al. |
| 7,181,030 B2 | 2/2007 | Rasmussen et al. |
| 7,346,178 B2 | 3/2008 | Zhe et al. |
| 7,359,504 B1 | 4/2008 | Reuss et al. |
| 7,362,873 B2 | 4/2008 | Pedersen |
| 7,539,613 B2 | 5/2009 | Takada |
| 7,578,196 B2 | 8/2009 | Riccoti et al. |
| 7,676,052 B1 | 3/2010 | Ma et al. |
| 7,756,282 B2 | 7/2010 | Rass et al. |
| 7,804,969 B2 | 9/2010 | Wang et al. |
| 7,805,821 B2 | 10/2010 | Suzuki |
| 7,813,517 B2 | 10/2010 | Klemenz et al. |
| 7,825,483 B2 | 11/2010 | Nakatani et al. |
| 7,836,770 B2 | 11/2010 | Goldberg et al. |
| 7,856,283 B2 | 12/2010 | Burk et al. |
| 7,856,804 B2 | 12/2010 | Laming et al. |
| 7,888,840 B2 | 2/2011 | Shimaoka et al. |
| 7,907,744 B2 | 3/2011 | Kasai et al. |
| 8,045,733 B2 | 10/2011 | Zhe et al. |
| 8,045,734 B2 | 10/2011 | Zhe et al. |
| 8,072,010 B2 | 12/2011 | Lutz |
| 8,150,084 B2 | 4/2012 | Jessen et al. |
| 8,175,293 B2 | 5/2012 | Suvanto |
| 8,194,881 B2 | 6/2012 | Haulick et al. |
| 8,223,981 B2 | 7/2012 | Haila et al. |
| 8,233,637 B2 | 7/2012 | Phelps et al. |
| 8,243,962 B2 | 8/2012 | Qiao |
| 8,270,634 B2 | 9/2012 | Harney et al. |
| 8,284,958 B2 | 10/2012 | Suvanto et al. |
| 8,327,711 B2 | 12/2012 | Kasai et al. |
| 8,351,625 B2 | 1/2013 | Kasai |
| 8,433,084 B2 | 4/2013 | Conti et al. |
| 8,477,983 B2 | 7/2013 | Weigold et al. |
| 8,934,649 B1 | 1/2015 | Lee et al. |
| 8,942,394 B2 | 1/2015 | Conti et al. |
| 2002/0057815 A1 | 5/2002 | Killion |
| 2003/0015040 A1* | 1/2003 | Ishio .............. G01L 9/0073 73/718 |
| 2003/0210799 A1 | 11/2003 | Gabriel et al. |
| 2007/0041597 A1 | 2/2007 | Song |
| 2007/0121972 A1 | 5/2007 | Suzuki et al. |
| 2007/0201710 A1 | 8/2007 | Suzuki et al. |
| 2007/0222006 A1 | 9/2007 | Weber et al. |
| 2008/0175399 A1 | 7/2008 | Kim et al. |
| 2008/0192962 A1 | 8/2008 | Halteren |
| 2008/0192963 A1 | 8/2008 | Sato |
| 2008/0205668 A1 | 8/2008 | Torii et al. |
| 2009/0002498 A1 | 1/2009 | Oku |
| 2009/0095081 A1 | 4/2009 | Nakatani |
| 2009/0208037 A1 | 8/2009 | Zhe |
| 2009/0316916 A1* | 12/2009 | Haila ................ H04R 3/005 381/57 |
| 2010/0117485 A1 | 5/2010 | Martin et al. |
| 2010/0158280 A1 | 6/2010 | Coronato et al. |
| 2010/0212432 A1* | 8/2010 | Kasai .............. H04R 19/005 73/654 |
| 2010/0254560 A1 | 10/2010 | Mehregany |
| 2011/0140213 A1 | 6/2011 | Kasia et al. |
| 2012/0093333 A1 | 4/2012 | Hu et al. |
| 2012/0269363 A1 | 10/2012 | Suvanto |
| 2013/0070942 A1 | 3/2013 | Kasai et al. |
| 2013/0208923 A1 | 8/2013 | Suvanto |
| 2013/0294622 A1 | 11/2013 | Kasai et al. |
| 2014/0191343 A1 | 7/2014 | Kasai et al. |

FOREIGN PATENT DOCUMENTS

| | | |
|---|---|---|
| JP | 62-213400 A | 9/1987 |
| JP | 03-139097 A | 6/1991 |
| JP | 10-126886 A | 5/1998 |
| JP | 2005-110204 A | 4/2005 |
| JP | 2006-101302 A | 4/2006 |
| JP | 2008-005439 A | 1/2008 |
| JP | 2009-081624 A | 4/2009 |
| JP | 2009-098022 A | 5/2009 |
| JP | 2009-124474 A | 6/2009 |
| JP | 4419103 B1 | 2/2010 |
| JP | 2011-4129 A | 1/2011 |
| SU | 1582361 A1 | 7/1990 |
| SU | 1670807 A1 | 8/1991 |
| WO | 2006/007441 A1 | 1/2006 |

OTHER PUBLICATIONS

Office Action dated Mar. 16, 2015, for U.S. Appl. No. 13/936,104, pp. 19.

Office Action dated Sep. 2, 2014, for corresponding Japanese Application No. 2011-002313, with partial English Translation, 5 pages.

Kasai et al., *Novel Concept for a Mems Microphone With Dual Channels for an Ultrawide Dynamic Range*, MEMS 2011, Cancun, Mexico, Jan. 23-27, 2011, pp. 605-608.

Kasai et al., *Small Silicon Condenser Microphone Improved With a Backchamber With Concave Lateral Sides*, Digest Tech. Papers Transducers 2007 Conference, pp. 2613-2616.

Leinenbach et al., *A New Capacitive Type MEMS Microphone*, Proc. MEMS 2010, pp. 659-662.

Scheeper et al., *A Review of Silicon Microphones*, Sensors and Actuators A 44, 1994, pp. 1-11.

Weigold et al., *A MEMS Condenser Microphone for Consumer Applications*, MEMS 2006, Istanbul, Turkey, Jan. 22-26, 2006, pp. 86-89.

* cited by examiner

ACOUSTIC TRANSDUCER AND INTERFACE CIRCUIT

BACKGROUND

1. Technical Field

The present disclosure relates to an acoustic transducer having a split membrane that converts a sound wave into electrical signals, and to a digital electronic interface circuit for an acoustic transducer.

2. Description of the Related Art

Conventionally, Electret Condenser Microphones have been used as a miniature microphone mounted on a cellular (mobile) phone. The ECM is weak against heat. On the other hand, a MEMS microphone is superior to the ECM in terms of digitalization, miniaturization, enhancement of functionality/multi-functionality, and power savings. Accordingly, at present, the MEMS microphone is becoming widespread.

The MEMS (microelectromechanical system) microphone includes a capacitor-type acoustic sensor (acoustic transducer) that detects a sound wave and converts the detected sound wave into an electrical signal (detection signal), a drive circuit that applies a voltage to the acoustic sensor, and a signal processing circuit that performs signal processing such as amplification on the detection signal from the acoustic sensor and outputs the processed detection signal to the outside. The drive circuit and the signal processing circuit are manufactured integrally with each other as an ASIC (Application Specific Integrated Circuit) by using a semiconductor manufacturing technology.

Such acoustic transducers, are known, including a micromechanical sensing structure, designed to transduce acoustic pressure waves into an electrical quantity (for example, a capacitive variation), and a reading electronics, designed to carry out suitable processing operations (amongst which amplification and filtering operations) of the electrical quantity so as to supply an electrical output signal, either analog (for example, a voltage) or digital (for example, a PDM—pulse density modulation—signal).

This electrical signal, is further processed by an electronic interface circuit, is then made available for an external electronic system, for example a microprocessor control circuit of an electronic apparatus incorporating the acoustic transducer.

The micromechanical sensing structure in general includes a mobile electrode, provided as a diaphragm or membrane, set facing a fixed electrode to provide the plates of a variable-capacitance detection capacitor. The mobile electrode is generally anchored, by means of a perimetral portion thereof, to a substrate, whilst a central portion thereof is free to move or deflect in response to the pressure exerted by incident acoustic pressure waves. The mobile electrode and the fixed electrode provide a capacitor, and the deflection of the membrane that constitutes the mobile electrode causes a variation of capacitance as a function of the acoustic signal to be detected.

Currently, a microphone can detect and output a large sound with high quality. In general, a maximum input sound pressure (dynamic range) is restricted by a total harmonic distortion (hereinafter, referred to as "THD"). This is because attempting to detect a large sound by the microphone results in generation of a harmonic distortion in an output signal, thereby leading to deterioration of sound quality. Namely, if the THD can be reduced, then the maximum input sound pressure can be increased.

However, in a general microphone, detection sensitivity for the sound wave and the THD have a trade-off relationship therebetween. Therefore, a high-sensitivity microphone has a large THD, so as to have a small maximum input sound pressure. This is because the high-sensitivity microphone tends to output a large signal and therefore is likely to cause the THD. Meanwhile, a low-sensitivity microphone causes a small THD, so as to have a large maximum input sound pressure. However, it is difficult for the low-sensitivity microphone to detect a small sound with high quality.

In order to cope with these problems, such a microphone which uses a plurality of acoustic sensors having respective different sensitivities has been studied (for example, refer to U.S. Pat. Nos. 8,223,981 and 8,233,637, U.S. Patent Application Publication 2007/0047746 (published on Mar. 1, 2007), and Japanese Unexamined Patent Publication No. 2008-245267 (published on Oct. 9, 2008)).

Each of U.S. Pat. Nos. 8,223,981 and 8,233,637 discloses a microphone including a plurality of acoustic sensors, wherein the plurality of acoustic sensors output a plurality of signals and the plurality of signals are switched or combined in response to a sound pressure. In particular, U.S. Pat. No. 8,223,981 discloses a microphone including a high-sensitivity acoustic sensor whose detectable sound pressure level (SPL) ranges from 20 dB to 110 dB and a low-sensitivity acoustic sensor whose detectable sound pressure level ranges from 50 dB to 140 dB, wherein the microphone uses the high-sensitivity acoustic sensor and the low-sensitivity acoustic sensor in a switching manner so as to achieve a detectable sound pressure level ranging from 20 dB to 140 dB. Moreover, each of Japanese Unexamined Patent Publication No. 2008-245267 and U.S. Patent Application Publication No. 2007/0047746 discloses a configuration including a plurality of acoustic sensors independently provided on a single chip.

However, according to the above configuration described in each of Japanese Unexamined Patent Publication No. 2008-245267 and U.S. Patent Application Publication No. 2007/0047746, the acoustic sensors are formed independently of one another, and therefore variation and mismatching in their acoustic characteristics occurs. Here, the expression "variation in the acoustic characteristics" refers to a difference between the chips with regard to the acoustic characteristics of the acoustic sensor. The expression "mismatching in the acoustic characteristics" refers to a difference between the plurality of acoustic sensors in a single chip with regard to the acoustic characteristics.

Specifically, the acoustic sensors have thin films warped in respective different manners, so that variations in the detection sensitivity occur between the chips independently. As a result, a large variation between the chips occurs in the difference between the detection sensitivities among the acoustic sensors. Further, the acoustic sensors have their respective back chambers and vent holes. Since acoustic characteristics such as frequency characteristics and phases are affected by the back chamber and the vent hole, mismatching in the acoustic characteristics occurs in the chip.

As mentioned, the electrical performance of the acoustic transducer depends on the mechanical characteristics of the sensing detection structure, and moreover on the configuration of the associated, front and rear, acoustic chambers, i.e., of the chambers facing a respective, front or rear, face of the membrane, and traversed in use by the pressure waves that impinge upon the membrane and that move away therefrom.

There are numerous applications in which detection of acoustic-pressure waves with a wide dynamic range are used, i.e., the possibility of detecting signals with a high sound-pressure level (SPL), while maintaining high values of the signal-to-noise ratio (SNR), and signals with a low sound-pressure level with a high sensitivity.

Basically, a frequently important design rule is to optimize the compromise between obtaining a wide dynamic range in detection of the acoustic-pressure waves and obtaining a low signal-to-noise ratio.

U.S. Pat. No. 6,271,780 discloses, in this connection, a solution for increasing the dynamic range in an acoustic system, comprising an analog-to-digital converter (ADC), designed to receive an analog detection signal from an acoustic transducer. This solution envisages subjecting the analog input signal, in parallel, to two signal-processing paths, which have a first, analog, portion and a second, digital, portion, and each of which has a respective amplification and gain factor so as to adapt, respectively, to signals with a low, or a high, acoustic pressure level. The two digital signals at output from the two processing paths are recombined to supply a resulting output signal. Prior to the operation of recombination, the two signals undergo an operation of equalization to take into account differences of gain, offset, and phase generated by the previous operations of signal processing, in part of an analog type, and thus prevent distortion of the resulting output signal.

This solution is not free from problems, due mainly to the complexity of the processing chain, to a relevant sensitivity to noise and oscillations of the input signal, and to a reduced configurability.

In general, it is thus certainly felt to provide an improved solution for extending the dynamic range in the detection of acoustic-pressure waves via an acoustic transducer.

BRIEF SUMMARY

The present embodiment describes an acoustic transducer which is capable of converting a sound wave into a plurality of electrical signals, and is capable of reducing the variations between the chips and the mismatching in the chip with regard to the acoustic characteristics. The present disclosure includes a digital electronic interface circuit for the acoustic transducer and a corresponding acoustic transducer system.

In accordance with one aspect, an acoustic transducer includes a substrate; a vibrating membrane, provided above the substrate, includes a vibrating electrode; and a fixed membrane, provided above the substrate, includes a fixed electrode; the acoustic transducer detecting a sound wave according to changes in capacitance between the vibrating electrode and the fixed electrode; converting the sound wave into electrical signals; and outputting the electrical signals, at least one of the vibrating electrode and the fixed electrode being divided into a plurality of divided electrodes and the plurality of divided electrodes outputting the electrical signals.

In accordance with the above configuration, at least one of the vibrating electrode and the fixed electrode is divided into divided electrodes, whereby a plurality of variable capacitors are formed between the vibrating electrode and the fixed electrode. This makes it possible to provide an acoustic transducer in which the plurality of divided electrodes respectively output the plurality of electrical signals, so that the sound wave is converted into the plurality of electrical signals.

Moreover, the plurality of variable capacitors are formed between the same vibrating membrane and the same fixed membrane. Hence, according to the present disclosure, the chips have similar variations between the detection sensitivities of the respective variable capacitors, in comparison with the conventional technique by which the plurality of vibrating membranes and the plurality of fixed membranes are provided independently. This makes it possible to reduce the variation between the chips with regard to the difference between the detection sensitivities of the variable capacitors.

Moreover, the variable capacitors share the vibrating membrane and the fixed membrane. This makes it possible to reduce, in the chip, mismatching in the acoustic characteristics such as the frequency characteristics and the phases.

As described above, according to the acoustic transducer of the present disclosure, at least one of the vibrating electrode and the fixed electrode is divided into a plurality of divided electrodes, whereby the plurality of variable capacitors are formed between the vibrating electrode and the fixed electrode. This makes it possible to provide the acoustic transducer in which the plurality of divided electrodes respectively output a plurality of electrical signals, so that the sound wave is converted into the plurality of electrical signals. Moreover, the plurality of variable capacitors are formed between the same vibrating membrane and the same fixed membrane. This makes it possible to reduce the variation between the chips with regard to the difference between the detection sensitivities of the variable capacitors, and to reduce, in the chip, the mismatching in the acoustic characteristics such as the frequency characteristics and the phases.

Another embodiment of the present disclosure is directed to a device that includes an audio signal processing circuit configured to receive a first audio signal and a second audio signal from a first membrane and a second membrane, respectively. The circuit includes a first processing path configured to process the first audio signal and configured to generate a first processed signal, a second processing path configured to process the first audio signal and configured to generate a second processed signal, and a recombination stage configured to receive the first processed signal and the second processed signal and configured to generate a mixed signal. The circuit also includes a selection stage configured to generate a selection signal based on a comparison of the first processed signal with an upper threshold value and a lower threshold value and a multiplexor configured to output one of the first processed signals, the second processed signal, the mixed signal based on the selection signal.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1A:
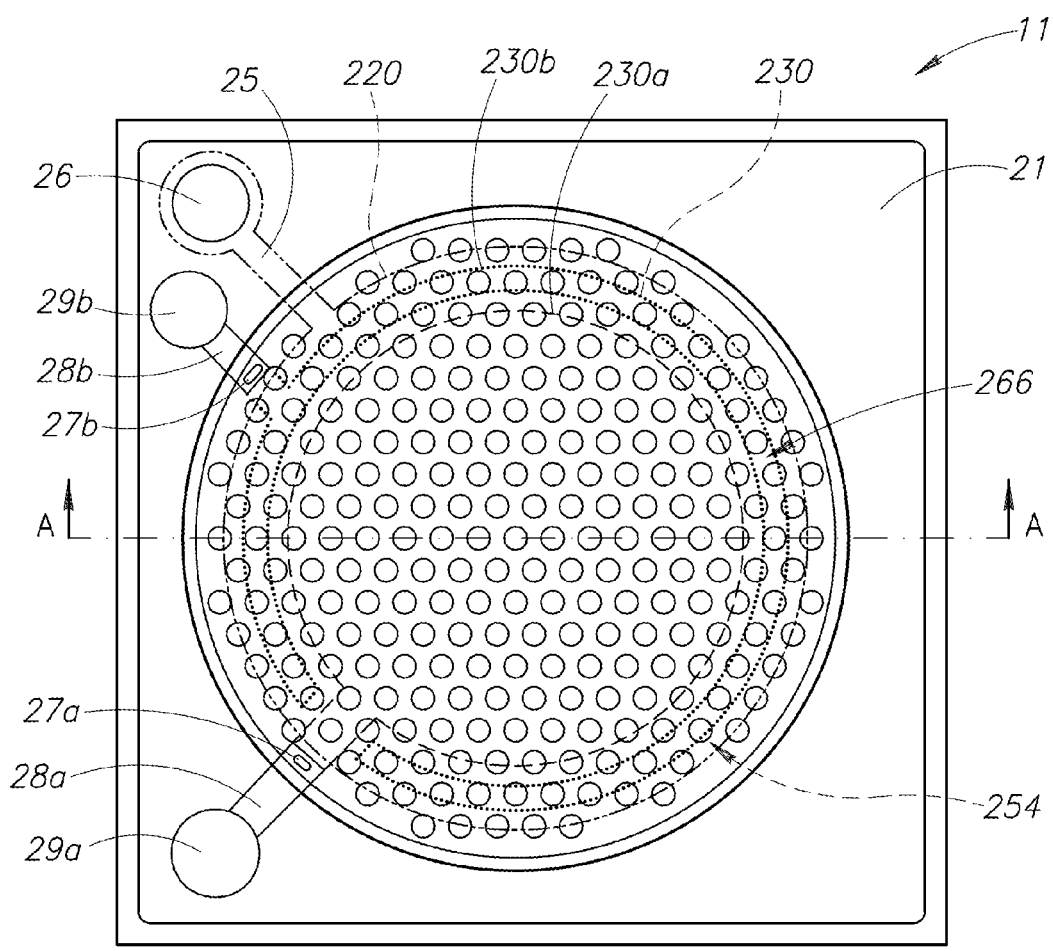
FIGS. 1A and 1B are a plan view and a cross-sectional view, which show a schematic configuration of an acoustic sensor in a MEMS microphone according to an embodiment of the present disclosure.

The following describes an embodiment of the present disclosure with reference to FIGS. 1A to 3. FIGS. 1A and 1B are top down and cross-sectional views of the acoustic sensor 11 in this embodiment. FIG. 1A is a top plan view of the acoustic sensor 11, and FIG. 1B is an enlarged cross-sectional view of the acoustic sensor 11, taken along line A-A shown in FIG. 1A and viewed in an arrow direction shown in FIG. 1A.

Figure 2A:
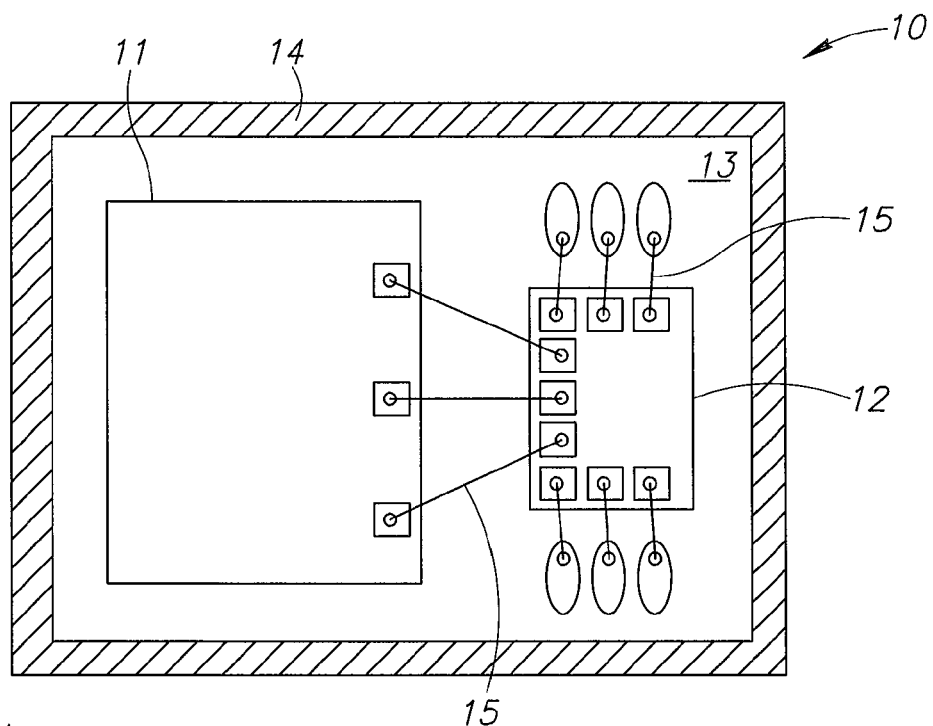
FIGS. 2A to 2C are a plan view and cross-sectional views, which show a schematic configuration of the MEMS microphone.
Figure 2B:
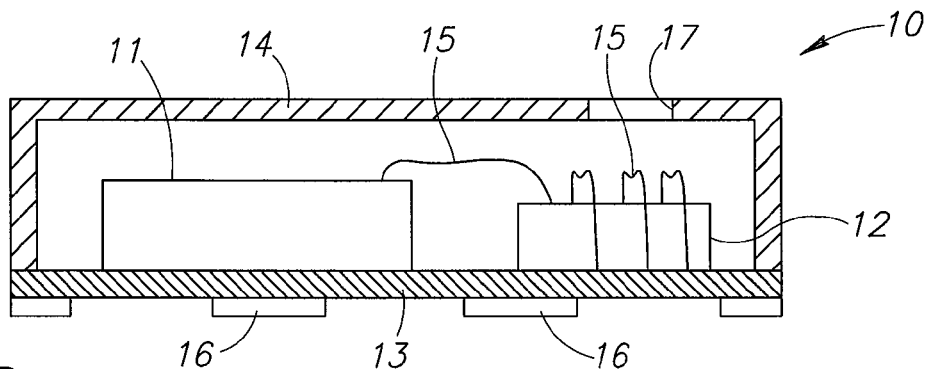
Figure 2C:
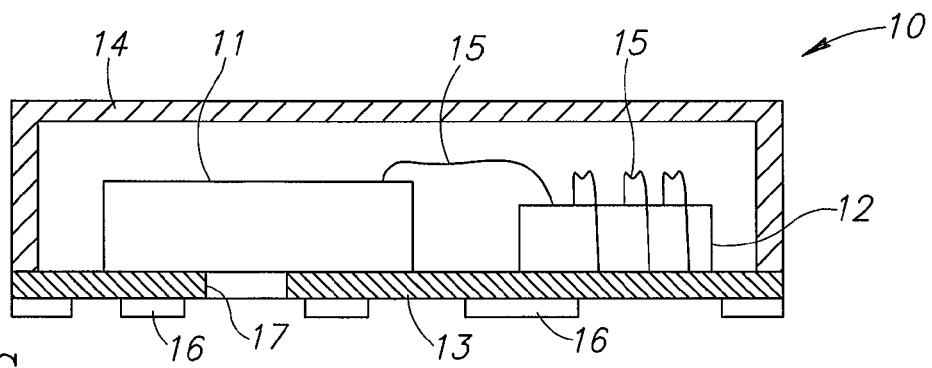

FIGS. 2A to 2C show a schematic configuration of a MEMS microphone package of this embodiment. FIG. 2A is a plan view showing a portion of the MEMS microphone package with an upper portion of the package cut away. FIGS. 2B and 2C are front views showing the MEMS microphone packages with a front portion cut away. Note that FIG. 2C is a modification of the configuration shown in FIG. 2B.

As shown in FIG. 2A, the MEMS microphone package 10 includes an acoustic sensor (acoustic transducer) 11, an ASIC 12, a wiring board or printed circuit board 13, and a cover 14.

The acoustic sensor 11 detects a sound wave and converts the sound wave into electrical signals (detection signals). The acoustic sensor 11 is a MEMS chip manufactured using a MEMS technique. The ASIC 12 is an integrated circuit (IC) that has a power supply function to supply power to the acoustic sensor 11 and a signal processing function to appropriately process the electrical signal from the acoustic sensor 11 and output the electrical signal to an external device. The ASIC 12 is a semiconductor chip manufactured using a semiconductor technique. The acoustic sensor 11 and the ASIC 12 are arranged on the wiring board 13, and are covered with the cover 14.

Electrical connection between the wiring board 13, the acoustic sensor 11, and the ASIC 12 is typically made by metal wires 15; however, connection can alternatively be made by gold bump bonding or the like. The wiring board 13 is provided with connection terminals 16 for electrically connecting the wiring board 13 to an external device. The connection terminals 16 on a bottom surface of the wiring board are used to receive power supplied from the outside, to output a signal to the outside, and the like. The wiring board 13 is mounted to a variety of devices, typically by surface reflow soldering, and is electrically connected thereto by the connection terminals 16.

The cover 14 protects the acoustic sensor 11 and the ASIC 12 from noise, physical contact, and other external forces. Therefore, the cover 14 has an electromagnetic shield layer provided on its outer layer or on an inner surface. Moreover, the cover 14 has a through hole 17 through which an external sound wave reaches the acoustic sensor 11. In FIG. 2B, the through hole 17 is provided in an upper side of the cover 14. Alternatively, the through hole 17 may be provided in a lateral side of the cover 14, or may be provided, as shown in FIG. 2C, in a region of the wiring board 13, on which region the acoustic sensor 11 is provided.

Figure 1B:
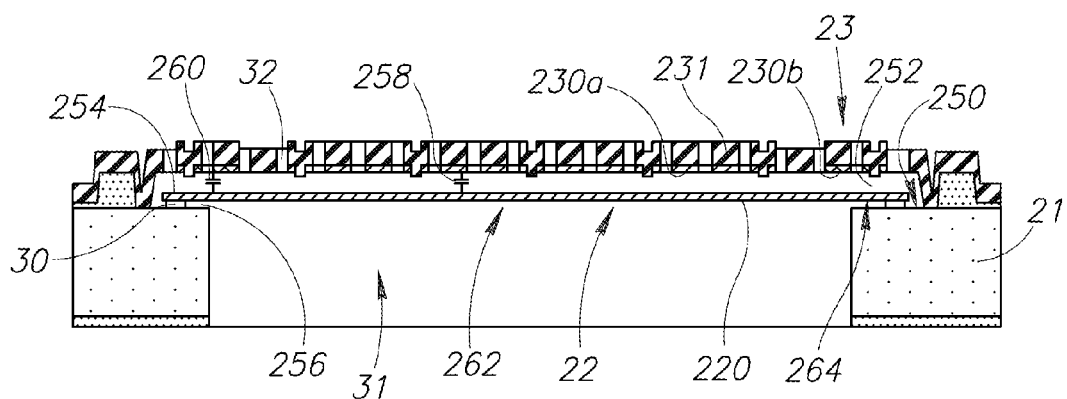

As shown in FIGS. 1A and 1B, the acoustic sensor 11 includes a semiconductor substrate 21 with a vibrating membrane 22 positioned on an upper surface 250 of the semiconductor substrate 21 and, further, a fixed membrane 23 covering the vibrating membrane 22. The vibrating membrane 22 is a conductor, and functions as a vibrating electrode 220. Meanwhile, the fixed membrane 23 includes a first fixed electrode 230a and a second fixed electrode 230b that are conductive, and a protecting membrane 231 that is an insulator for protecting the fixed electrodes 230a, 230b. The vibrating electrode 220 and the fixed electrodes 230a, 230b are facing each other with a gap 252 therebetween, and function as a capacitor.

An edge portion 254 of the vibrating membrane 22 is attached to the upper surface 250 of the semiconductor substrate 21 via an insulating layer 30. The insulating layer 30 is disposed between the edge portion 254 of the vibrating membrane 22 and the semiconductor substrate 21 so that the edge portion 254 of the vibrating membrane 22 and the semiconductor substrate 21 are spaced apart from each other by a distance. This provides a gap (vent hole) 256 between the edge portion of the vibrating membrane 22 and the semiconductor substrate 21.

Moreover, the semiconductor substrate 21 has an opening (back chamber) 31. Furthermore, the fixed membrane 23 has a large number of sound hole portions 32 each forming a sound hole. Typically, the sound hole portions 32 are arranged regularly at equal intervals, and the sound holes of the respective sound hole portions 32 have substantially the same size.

In the configuration of FIG. 2B, a sound wave will pass through the through hole 17 and the sound hole portions 32 of the fixed membrane 23, and will reach the vibrating membrane 22. Moreover, in the case of FIG. 2C, the through hole 17 and the opening 31 of the acoustic sensor 11 are connected to each other, and the sound wave will pass through the through hole 17 and the opening 31, and will reach the vibrating membrane 22. In comparison with the case of FIG. 2B, the configuration of FIG. 2C makes it possible to reduce deteriorations of sensitivity and frequency characteristics occurring due to a volume effect of the opening 31.

In the acoustic sensor 11 having the above configuration, an external sound wave reaches the vibrating membrane 22 through the sound hole portions 32 of the fixed membrane 23 or through the opening 31. At this time, the vibrating membrane 22 vibrates upon application of a sound pressure of the sound wave that has reached the vibrating membrane 22. This changes an interval (air gap) between the vibrating electrode 220 and the fixed electrodes 230a, 230b, thereby changing a capacitance between the vibrating electrode 220 and the fixed electrodes 230a, and 230b. By converting the change of the capacitance into a change in a voltage or a current, the acoustic sensor 11 can detect the external sound wave and convert the detected sound wave into electrical signal (detection signal).

The acoustic sensor 11 having the above configuration includes the fixed membrane 23 having the large number of sound hole portions 32. Besides allowing the external sound wave to pass therethrough to reach the vibrating membrane 22, the sound hole portions 32 have the following functions:

(1) The sound hole portions 32 allow the sound wave that has reached the fixed membrane 23 to pass through, so that the sound pressure applied to the fixed membrane 23 is reduced.

(2) The sound hole portions 32 allow the air between the vibrating membrane 22 and the fixed membrane 23 to go in and out through the sound hole portions 32. This results in a reduction in thermal noise (air fluctuations). Moreover, this reduces damping of the vibrating membrane 22, which is caused by the air, thereby reducing deterioration of high frequency characteristics that may be caused by the damping.

(3) The sound hole portions 32 can be used as etching holes for forming the gap between the vibrating electrode 220 and the fixed electrodes 230a, 230b by a surface micromachining technique.

In this embodiment, the semiconductor substrate 21 is a semiconductor, which has a thickness of approximately 400 μm, and is made from monocrystalline silicon or the like. The vibrating membrane 22 is a conductor, which has a thickness of approximately 0.7 μm, and is made from polycrystalline silicon or the like. The vibrating membrane 22 functions as the vibrating electrode 220. The fixed membrane 23 includes the fixed electrodes 230a, 230b and the protecting membrane 231. The fixed electrodes 230a, 230b are conductors, which have a thickness of approximately 0.5 μm, and are made from polycrystalline silicon and the like. The protecting membrane 231 is an insulator, which has a thickness of approximately 2 μm, and is made from silicon nitride or the like. Moreover, the gap 252 between the vibrating electrode 220 and the fixed electrodes 230a, 230b is approximately 4 μm.

In this embodiment, as shown in FIGS. 1A and 1B, the fixed electrodes 230a, 230b are divided into the first electrode 230a provided centrally in the fixed membrane 23, and the peripheral second electrode 230b provided peripherally in the fixed membrane 23. The first electrode 230a and the second electrode 230b are electrically isolated from each other. The first electrode 230a is connected to a connection terminal 29a through a contact portion 27a and a wiring strip 28a. Meanwhile, the second electrode 230b is connected to a connection terminal 29b through a contact portion 27b and a wiring strip 28b. Note that the vibrating electrode 220 is connected to a connection terminal 26 through the wiring strip 25.

Thus, the capacitors made of the vibrating electrode 220 and the fixed electrodes 230a, 230b are divided into (i) a first capacitor 258, which includes the first electrode 230a and a central portion 262 of the vibrating electrode 220, and (ii) a second peripheral capacitor 260, which includes the second electrode 230b and the peripheral portion 264 of the vibrating electrode 220. Thus, the acoustic sensor 11 of this embodiment is capable of converting an external sound wave into an electrical signal from the first capacitor 258 and an electrical signal from the second capacitor 260.

Since, the vibrating membrane 22 is fixed at the edge portions 254, the central portion 262 of the vibrating membrane 22 is displaced a large amount as a result of vibration, and the peripheral portion 264 of the vibrating membrane 22 is displaced a small amount as a result of vibration. Thus, the first capacitor 258 serves as a high-sensitivity capacitor having a high detection sensitivity, and the second capacitor 260 serves as a low-sensitivity capacitor having a low detection sensitivity. Hence, the acoustic sensor 11 of this embodiment is capable of converting an external sound wave into two electrical signals with different detection sensitivities. In this manner, the acoustic sensor 11 of this embodiment achieves an expanded detectable sound pressure level, in comparison with the conventional acoustic sensor including only one variable capacitor. Moreover, the first electrode 230a has a wider area than the second electrode 230b. Accordingly, this makes it possible to expand the detectable sound pressure level.

Moreover, in this embodiment, the fixed electrodes 230a, 230b are divided or otherwise electrically isolated, but the vibrating membrane 22 and the protecting membrane 231 are in a single part. Thus, in comparison with the conventional acoustic sensor including the separate vibrating membrane and the separate protecting membrane, the chips have similar variations between the detection sensitivities of the first capacitor 258 and the second capacitor 260. This makes it possible to reduce variations between the chips with regard to the difference between the detection sensitivities of the first capacitor 258 and the second capacitor 260.

Moreover, the first capacitor 258 and the second capacitor 260 share the vibrating membrane 22 and the protecting membrane 231. This makes it possible to reduce, in the chip, the mismatching in acoustic characteristics, such as frequency characteristics and phases. Furthermore, the first capacitor 258 and the second capacitor 260 share the back chamber 31, the air gap 252, and the vent hole 256. This makes it possible to further reduce, in the chip, the mismatching in the acoustic characteristics.

Incidentally, in the case of the above configuration described in each of Japanese Unexamined Patent Publication No. 2008-245267 and U.S. Patent Application Publication No. 2007/0047746, the plurality of independent acoustic sensors are formed on one chip and, as such, the size of the chip is increased. Moreover, the configuration has an increased number of longer wires extending from the respective acoustic sensors to the ASIC, thereby resulting in an increase in parasitic capacitance and parasitic resistance. This leads to deterioration of various characteristics (such as, the detection sensitivity and SNR (signal-to-noise ratio)).

As opposed to this, in this embodiment, the first capacitor 258 and the second capacitor 260 are formed with the vibrating membrane 22 and the fixed membrane 23. Therefore, as compared with conventional techniques, this embodiment can reduce the size of the chip and reduce the length of the wires, thereby making it possible to prevent deterioration of the various characteristics.

Moreover, in this embodiment, the air gap 252 is constant in size while the vibrating membrane 22 stands still. This makes it possible to further reduce, in the chip, the mismatching in the acoustic characteristics, since the first capacitor 258 and the second capacitor 260 are provided in the same interval between the vibrating electrode 220 and the fixed electrodes 230a, 230b. According to this embodiment, it is possible to simplify the step of forming the vibrating electrode 220 and the fixed electrodes 230a, 230b in the manufacturing process of the acoustic sensor 11.

Moreover, in this embodiment, each of the vibrating electrode 220 and the fixed electrodes 230a, 230b is formed to have a uniform thickness. This allows the chips to have more similar variations between the detection sensitivities of the first capacitor 258 and the second capacitor 260 where the variations are caused by fabrication. This makes it possible to reduce the variation between the chips with regard to the difference between the detection sensitivity of the first capacitor 258 and the second capacitors 260.

Moreover, in this embodiment, the vibrating membrane 22 has a base portion 266 that is circular. In comparison with a vibrating membrane having a base portion that is rectangular or square, the vibrating membrane 22 of this embodiment can reduce a concentration of a stress. As a result, durability against an external stress and an internal stress is enhanced.

Moreover, in this embodiment, the vent hole 256 is present between the substrate 21 and the membrane 22. Accordingly, in comparison with a configuration in which the vent hole is not present, the displacement of the vibrating membrane can be increased, and the detection sensitivity can be enhanced. Moreover, this configuration makes the vibrating membrane less likely to be warped by external force and the like. Accordingly, the acoustic characteristics are less likely to be varied and influence by variations of an outside air pressure are reduced.

Note that a method of manufacturing the acoustic sensor 11 of this embodiment is different from the method of manufacturing the conventional acoustic sensor only in terms of a mask for forming the first electrode 230a. Specifically, by the mask of this embodiment, the first electrode 230a and the second electrode 230b are formed separately.

That is, first, a sacrificial layer ($SiO_2$) is formed on an upper surface of a monocrystalline silicon substrate serving as the semiconductor substrate 21. Next, a polycrystalline silicon layer is formed and etched on the sacrificial layer, whereby the vibrating membrane 22 is formed. Next, another sacrificial layer is formed so as to cover the vibrating membrane 22.

Next, a polycrystalline silicon layer and a silicon nitride layer are formed, so as to cover the sacrificial layer, and then etched, whereby the fixed membrane 23, including the fixed electrodes 230a, 230b and the protecting membrane 231, is formed. Here, the polycrystalline silicon layer is formed so as to be separated into a central portion and a peripheral portion by a mask pattern and the like, whereby the fixed electrodes 230a, 230b is formed separately as the first electrode 230a and the second electrode 230b.

Next, the monocrystalline silicon substrate is etched, whereby the opening 31 is formed. Then the sacrificial layer is etched through the sound hole portions 32, whereby the air gap between the vibrating membrane 22 and the fixed membrane 23 is formed, the insulating layer 30 is formed, and thus, the acoustic sensor 11 is completed.

Figure 3:
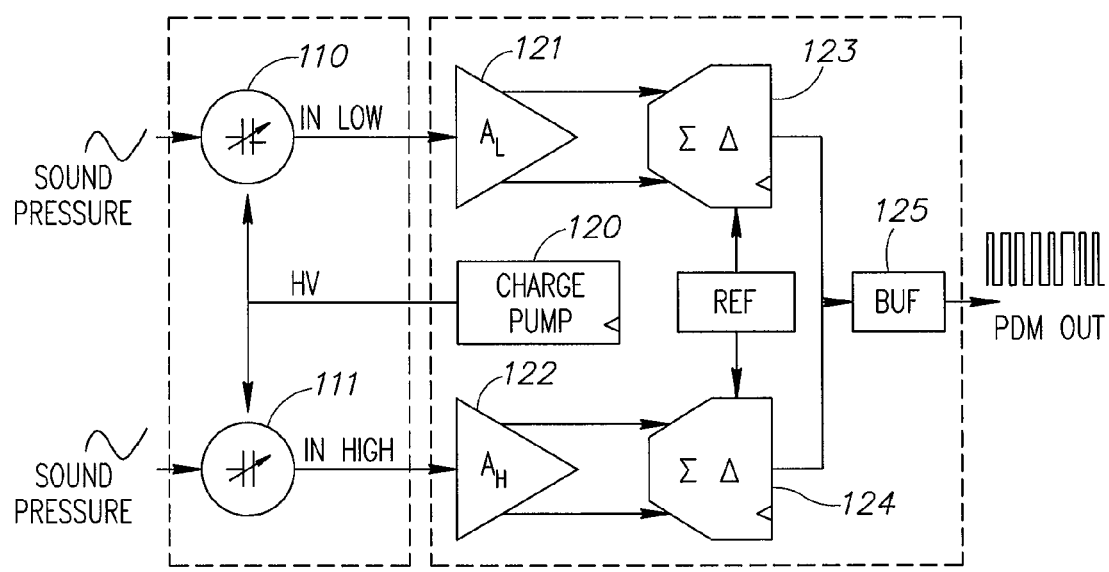
FIG. 3 is a circuit diagram of the MEMS microphone.

FIG. 3 is a circuit diagram of the MEMS microphone 10 shown in FIG. 2A. As shown in FIG. 3, the acoustic sensor 11 includes a low-sensitivity variable capacitor 110 and a high-sensitivity variable capacitor 111, each of which has a capacitance that is changed by the sound wave. The low-sensitivity variable capacitor 110 corresponds to the second capacitor 260, and the high-sensitivity variable capacitor 111 corresponds to the first capacitor 258.

Moreover, the ASIC 12 includes a charge pump 120, an amplifier 121 for a low-sensitivity variable capacitor, an amplifier 122 for a high-sensitivity variable capacitor, ΣΔ (sigma-delta, ΔΣ-type) ADCs (Analog-to-Digital Converters) 123 and 124, and a buffer 125.

A high voltage HV outputted from the charge pump 120 is applied to the variable capacitors 110 and 111 of the acoustic sensor 11, whereby the sound wave is converted into electrical signals by the variable capacitors 110 and 111. The electrical signal converted by the low-sensitivity variable capacitor 110 is amplified by the amplifier 121 for the low-sensitivity variable capacitor, and is converted into a digital signal by the ΣΔ-type ADC 123. In a similar manner, the electrical signal converted by the high-sensitivity variable capacitor 111 is amplified in the amplifier 122 for the high-sensitivity variable capacitor, and is converted into a digital signal by the ΣΔ-type ADC 124. The digital signals converted by the ΣΔ-type ADCs 123 and 124 are outputted as PDM (pulse density modulation) signals through the buffer 125 to the outside.

Note that, in the example of FIG. 3, two digital signals obtained as a result of the conversion by the ΣΔ-type ADCs 123 and 124 are described as being combined with each other and are outputted to a single data line. Alternatively, the two digital signals may be outputted to different data lines.

In this embodiment, the fixed electrodes 230a, 230b are divided, and the vibrating electrode 220 is not divided. In this case, in comparison with the configuration where both of the fixed electrodes 230a, 230b and the vibrating electrode 220 are divided, this embodiment has fewer connections to the ASIC 12 so that productivity is enhanced. Moreover, the number of connection terminals to the ASIC 12 is decreased, which makes it possible to reduce the parasitic capacitance caused by the connection terminals, so as to improve the characteristics. Moreover, only a single voltage is applied from the charge pump 120 to the variable capacitors. Accordingly, the size of the ASIC 12, including the charge pump 120, can be reduced, manufacturing costs can be reduced, and variations in the difference between the detection sensitivities can be reduced, where the variation is caused by variations in fabrication of the charge pump 120.

Figure 27:
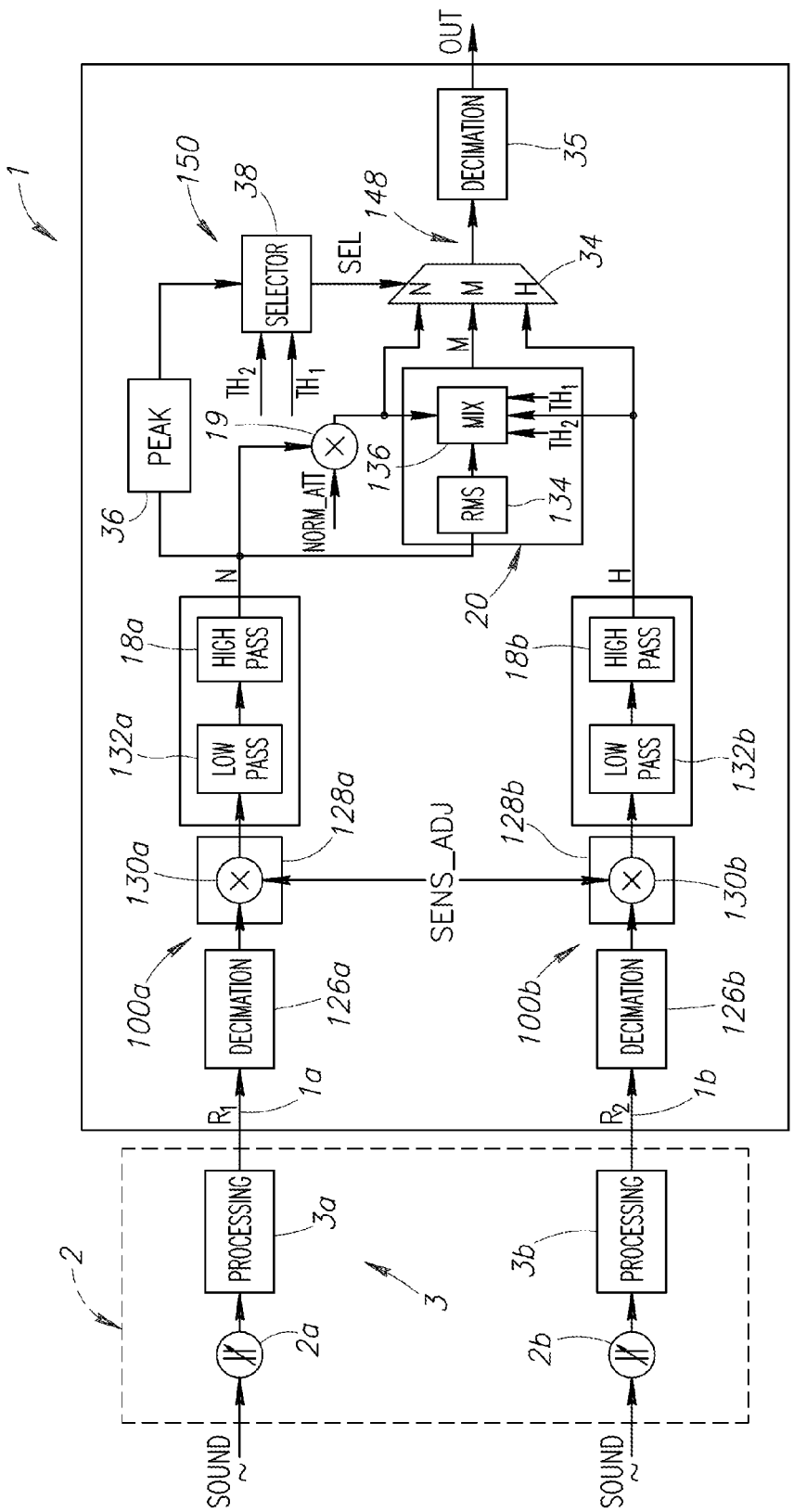
FIG. 27 is a block diagram of a digital electronic interface circuit, coupled to an acoustic transducer, according to an aspect of the present disclosure.

FIG. 27 is an alternative embodiment of a digital electronic interface circuit 1 for an acoustic transducer 2. The acoustic transducer 2 may be any one of the acoustic transducers described in this disclosure. The acoustic transducer 2 includes a first micromechanical sensing structure 2a and a second micromechanical sensing structure 2b, distinct from the first, for example provided in a distinct die of semiconductor material, or in a distinct portion of one and the same die of semiconductor material. For example, the first sensing structure 2a may correspond to the central portion 262 of the vibrating membrane 220 and the second sensing structure 2b may correspond to the peripheral portion 264.

The micromechanical sensing structures 2a, 2b are represented schematically in FIG. 27 by means of a respective capacitor, with a capacitance that varies as a function of the incident acoustic-pressure waves.

Each micromechanical sensing structure 2a, 2b may comprise a respective membrane, designed to undergo a deformation as a function of the incident acoustic-pressure waves; the micromechanical sensing structures 2a, 2b have different mechanical characteristics, for example in terms of a different rigidity in regard to deformations, which determine different electrical characteristics in detection of the acoustic-pressure waves.

In particular, the first micromechanical sensing structure 2a is configured for detecting signals having a first (maximum) sound-pressure level, for example with an acoustic overload point (AOP) of 120 dBSPL, whereas the second micromechanical sensing structure 2b is configured for detecting signals having a second acoustic pressure level, higher than the first level, for example with an AOP of 140 dBSPL.

The acoustic transducer 2 further comprises an ASIC electronic circuit 3, having: a first channel 3a, which is coupled to the first micromechanical sensing structure 2a, and supplies, on a first output, a first detection signal $R_1$, of a digital type, as a function of the electrical signals transduced by the first micromechanical sensing structure 2a; and a second channel 3b, which is coupled to the second micromechanical sensing structure 2b and supplies on a second output a second detection signal $R_2$, of a digital type, as a function of the electrical signals transduced by the second micromechanical sensing structure 2b.

Given the same signal (i.e., in the presence of one and the same value of sound pressure level (SPL)) the first channel 3a hence has an electrical signal of a higher value than the second channel 3b. The membrane transforms a physical value into an electrical one.

The first and second detection signals are, for example, PDM (pulse-density modulation) signals, and the first and second channels 3a, 3b include a respective sigma-delta modulator (of a known type, not described in detail herein).

As mentioned above, with respect to FIG. 3, the ASIC 3 may have a single output, on which the detection signals are combined in a suitable manner (for example, with an interlacing technique). In this case, a reconstruction stage is used for reconstruction of the detection signals starting from the interlaced flow of data, for their subsequent processing.

The digital electronic interface circuit 1 has a first input 1a and a second input 1b, which are designed to receive, respectively, the first and second detection signals $R_1$, $R_2$, directly from the acoustic transducer 2, or, alternatively, from the appropriate reconstruction stage for reconstruction of the signals starting from the data flow present on the possible single output of the acoustic transducer 2.

According to one aspect of the present disclosure, the digital electronic interface circuit 1 carries out, as described in detail hereinafter, a recombination operation for recombination of the first and second detection signals $R_1$, $R_2$, for generating a resulting output signal in order to widen the dynamic range and achieve an optimized compromise with the signal-to-noise ratio.

Figure 28:
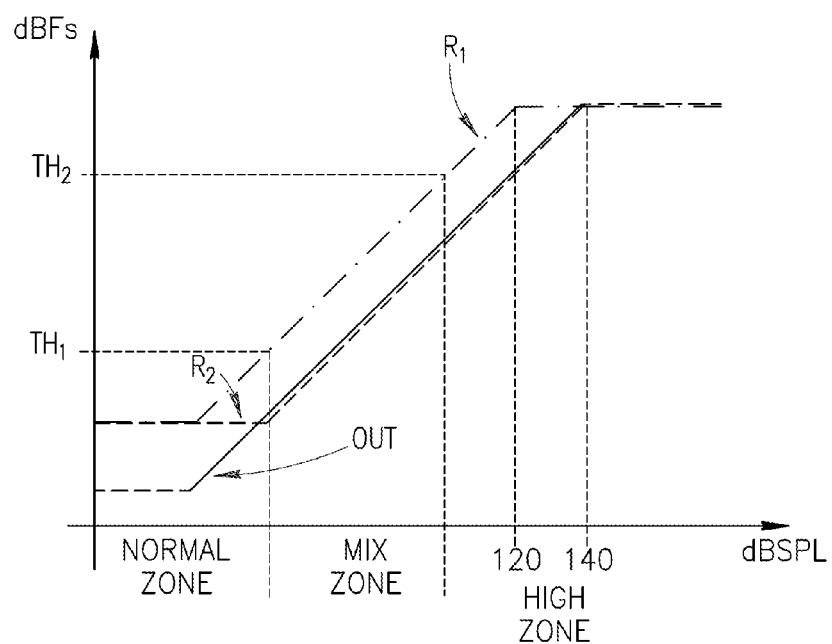
FIG. 28 shows plots of acoustic quantities associated to the acoustic transducer of FIG. 27.

In general, this recombination operation, illustrated schematically in FIG. 28, is based on level measurements of the level of the first detection signal $R_1$ and on the comparison of the measured levels with a lower threshold and with an upper threshold, designated by $Th_1$ and $Th_2$, respectively, in FIG. 28:

if the level of the detection signal is higher than the upper threshold $Th_2$, the resulting output signal (the characteristic curve of which is shown with a solid line) is supplied starting from the processing of the second detection signal $R_2$ at output from the second channel 3b (the characteristic curve of which is shown with a dashed line);

if the level of the detection signal is lower than the lower threshold $Th_1$, the resulting output signal is supplied starting from the processing of the first detection signal $R_1$ at output from the first channel 3a (the characteristic curve of which is shown with a dashed-and-dotted line); and if the level of the detection signal is comprised between the lower threshold $Th_1$ and the upper threshold $Th_2$, the resulting output signal is supplied starting from a suitable combination of the first and second detection signals $R_1$, $R_2$.

In detail, as shown in FIG. 27, the interface circuit 1 comprises a first processing branch 100a, connected to the first input 1a and designed to carry out digital processing of the first detection signal $R_1$, and a second processing branch 100b, connected to the second input 1b and designed to carry out digital processing of the second detection signal $R_2$.

Each processing branch 100a, 100b comprises: a respective first decimation block 126a, 126b, which receives at input the first detection signal $R_1$ or the second detection signal $R_2$, respectively, and carries out an operation of decimation on the samples of the same signal (the decimation process also comprising a finite impulse response (FIR) low-pass filtering), and a respective adjustment block 128a, 128b, including a respective first multiplier 130a, 130b, for multiplying the signal at output from the first decimation stage 126a, 126b by an adjustment factor Sens_Adj, of a configurable value and such as to compensate for any possible differences between a theoretical value and an effective value of the detection sensitivity of the micromechanical sensing structures 2a, 2b of the acoustic transducer 2. Opportunely configuring Sens_Adj and Normal_Atten make it possible to use the recombination also with other types of microphone (always two membranes but with different sensibility characteristics).

Each processing branch 100a, 100b further comprises, cascaded at output from the respective adjustment block 128a, 128b: a low-pass filtering block 132a, 132b; and a high-pass filtering block 18a, 18b.

In particular, the low-pass filtering block 132a, 132b implements a digital filter, for example of a second-order infinite impulse response (IIR) type with cutoff frequency of 20 kHz, for eliminating possible noise outside the audio band in the first detection signal $R_1$ or the second detection signal $R_2$.

Also the high-pass filtering block 18a, 18b implements an IIR digital filter in order to eliminate possible DC offset and environmental noise, for example disturbance due to the wind, the so-called "wind noise".

The first processing branch 100a further comprises a second multiplier 19, which receives the filtered signal at output from the high-pass filtering block 18a, designated by N (corresponding to the processing of the first detection signal $R_1$, for this reason defined in what follows as "first filtered detection signal") and multiplies it by an attenuation factor Norm_Att, of a configurable value and such as to compensate for the differences of sensitivity and gain between the first and second micromechanical sensing structures 2a, 2b and between the first and second channels 3a, 3b of the ASIC 3 of the acoustic transducer 2.

The interface circuit 1 further comprises a recombination stage 20, including a first level-measurement block 134 and a mixing block 136.

Figure 29:
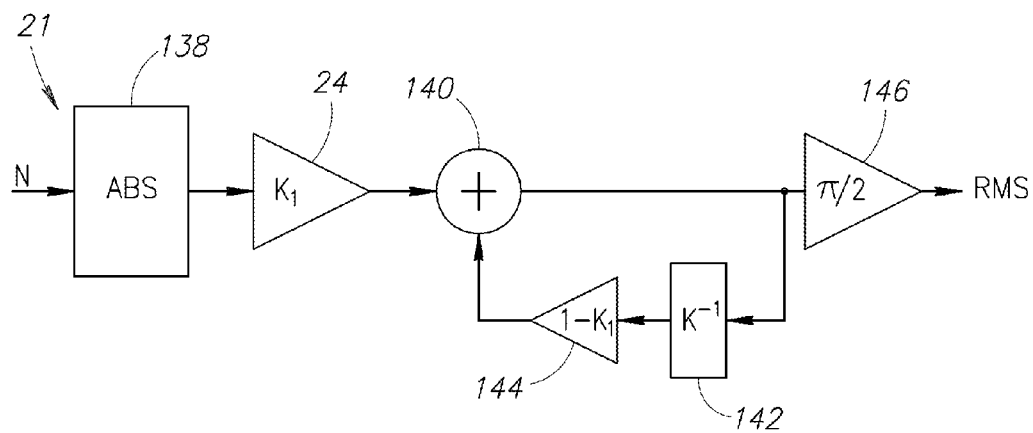
FIG. 29 is a block diagram of a first level meter in the interface circuit of FIG. 27.

The first level-measurement block 134 has an input connected to the output of the high-pass filtering block 18a of the first processing branch 100a, and is configured, as illustrated in FIG. 29, so as to measure the root-mean-square (RMS) value of the first filtered detection signal N.

In detail, the first level-measurement block 134 comprises: an absolute-value calculation unit 138, which receives at input the first filtered detection signal N and calculates the absolute value thereof; a first multiplier unit 24, with multiplying factor $K_1$, connected to the output of the absolute-value calculation unit 138; an adder unit 140, having a first sum input, connected to the output of the first multiplier unit 24, a second sum input, and an output; a feedback path connected between the output and the second input of the adder unit 140, and including a unit-delay unit 142 and, cascaded thereto, a second multiplier unit 144, with multiplying factor $(1-K_1)$; and a third multiplier unit 146, with multiplying factor equal to $\pi/2$, having its input connected to the output of the adder unit 140 and its output that supplies the root-mean-square value RMS.

As shown in FIG. 27, the mixing block 136 of the recombination stage 20 has: a first input receiving the root-mean-square value RMS from the first level-measurement block 134; a second input, which is connected to the output of the second multiplier 19 and hence receives the first filtered detection signal N, attenuated by the attenuation factor Norm_Att; a third input, which is connected to the output of the high-pass filtering block 18b of the second processing branch 100b and hence receives the second filtered detection signal (designated by H); and a fourth input and a fifth input, which receive, respectively, the lower threshold $Th_1$ and the upper threshold $Th_2$, having configurable values.

The mixing block 136 is configured so as to supply at output a mixing signal, designated by M, which is given by the following expression:

$$M = H\left[1 - \frac{Th_2 - \text{RMS}}{Th_2 - Th_1}\right] + N\left[\frac{Th_2 - \text{RMS}}{Th_3 - Th_1}\right]$$

Basically, the mixing signal M is obtained by means of the weighted combination of the first and second filtered detection signals N, H (the first filtered detection signal N being also appropriately attenuated), with a weight that is a function of the distance of the level of the acoustic signal detected from the set threshold, in particular the upper threshold $Th_2$.

As it will be clear, in the limit case where the level of the detected acoustic signal, in particular the root-mean-square value RMS of the first filtered detection signal N, is equal to the upper threshold $Th_2$, the mixing signal corresponds to the second filtered detection signal H, whereas in the limit case where the level of the detected acoustic signal is equal to the lower threshold $Th_1$, the mixing signal corresponds to the first filtered detection signal N.

The interface circuit 1 further comprises an output stage 148 and a selection stage 150.

The output stage 148 in turn comprises a multiplexer unit 34, having: a first input, which is connected to the output of the second multiplier 19 and hence receives the first filtered detection signal N, attenuated by the attenuation factor Norm_Att; a second input, which is connected to the output of the high-pass filtering block 18b of the second processing branch 100b and hence receives the second filtered detection signal H; a third input, which is connected to the output of the recombination stage 20 and receives the mixing signal M; and an output, which is selectively connected alternatively to the first input, to the second input, or to the third input, as a function of a selection signal Sel, which is received from the selection stage 150, as defined more clearly hereinafter.

The output stage 148 further comprises a second decimation block 35, which has its input connected to the output of the multiplexer unit 34 and an output on which it supplies, after an appropriate operation of decimation on the samples of the signal received at input (once again including also a low-pass FIR filtering), the signal at output Out from the interface circuit 1, making it available to an external electronic system.

The selection stage 150 comprises a second level-measurement block 36 and a selector block 38. One example of a second level-measurement block 36 is a peak detector and the block is labeled "peak" in FIGS. 27 and 32, however this term is not limiting to peak detection being the sole second level-measurement. While peak signal value is one acceptable criteria in one preferred embodiment for the second level-measurement, other signals can able be used for the second level measurement.

Figure 30:
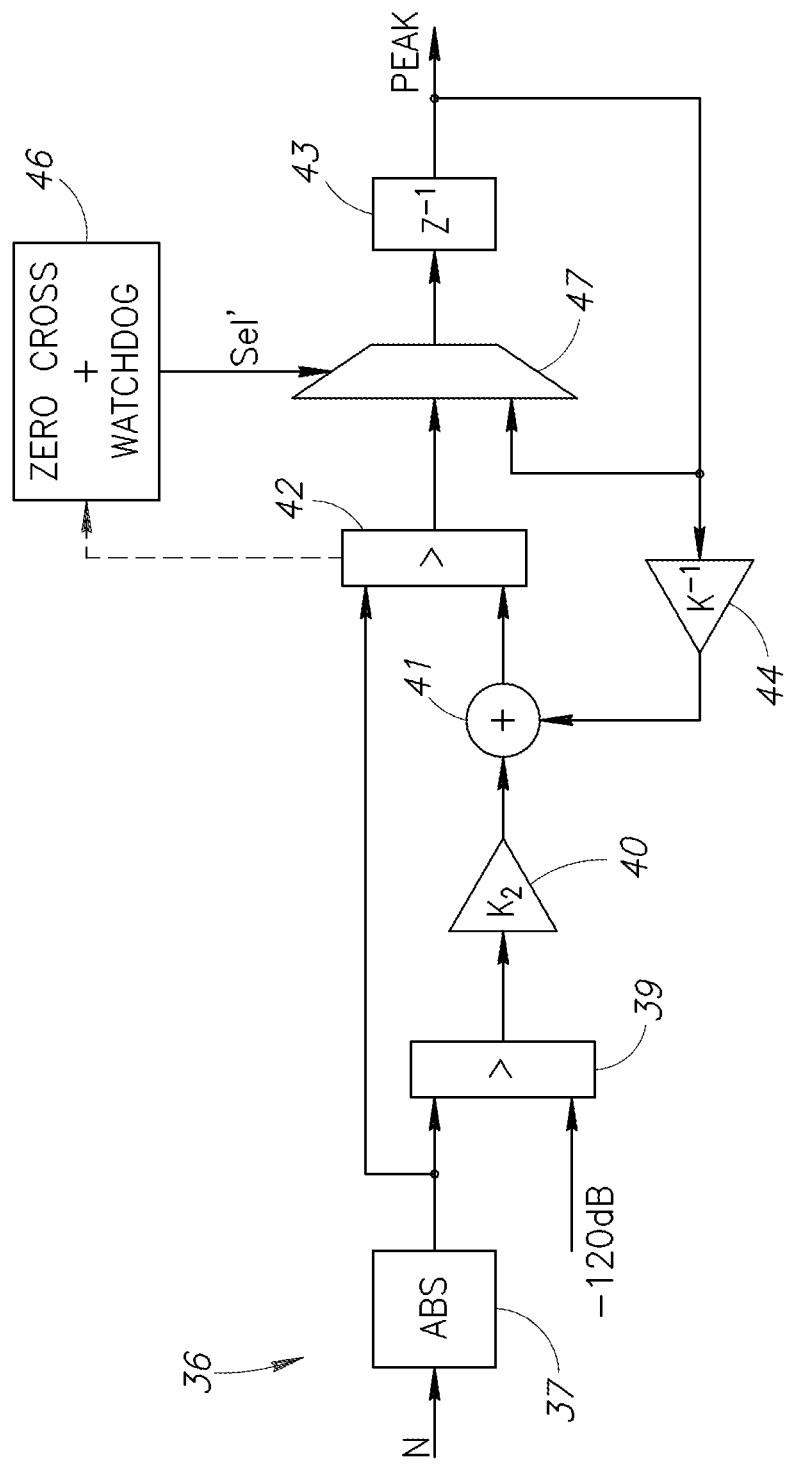
FIG. 30 is a block diagram of a second level meter in the interface circuit of FIG. 27.

The second level-measurement block 36 has an input connected to the output of the high-pass filtering block 18a of the first processing branch 100a, and is configured, as illustrated in FIG. 30, so as to measure the peak level of the first filtered detection signal N.

In detail, the second level-measurement block 36 comprises, in one embodiment: a respective absolute-value calculation unit 37, which receives at input the first filtered detection signal N and calculates the absolute value thereof; a first comparator unit 39, which compares the absolute value previously calculated with a noise reference value, for example equal to −120 dB, indicating a noise threshold in order to filter the contribution of noise that may be present (hence operating as a sort noise-gate); a respective first multiplier unit 40, with multiplying factor $K_2$, connected to the output of the comparator unit 39; and a respective adder unit 41, having a first sum input, connected to the output of the first multiplier unit 40, a second sum input, and an output.

The second level-measurement block 36 further comprises: a second comparator unit 42, which receives at input the samples of the absolute value of the first filtered detection signal N and the samples of the signal at output from the adder unit 41, and each time determines the highest; and a feedback path, which is connected between the output of the second comparator unit 42 and the second input of the adder unit 41, and includes a respective unit-delay unit 43 and, cascaded thereto, a respective second multiplier unit 44, with multiplying factor $K_3$.

As it will be clear, the adder unit 41, the second comparator unit 42, and the feedback path implement a decay stage, and make it possible to follow the peaks of the input signal and hold them with a certain decay factor, determined, amongst other elements, by the values of the multiplying factors $K_2$ and $K_3$ (for example, the decay factor is equal to 3.7 dB/ms).

The second level-measurement block 36 further comprises a control unit 46 and a multiplexer unit 47.

The multiplexer unit 47 has a first input connected to the output of the second comparator unit 42 and a second input connected to the input of the second multiplier unit 44, and an output, which is connected to the output of the second level-measurement block 36, and hence supplies the peak signal Peak, as a function of a control signal Sel'.

The control unit 46 has zero-crossing and watchdog functions and is configured so as to monitor, sample after sample of the digital signals, the result of the comparison carried out by the second comparator unit 42, and so as to generate the control signal Sel' for the multiplexer unit 47.

In particular, the control unit 42 analyses the zero-crossings of the signal that is the result of the comparison carried out in the second comparator unit 42 and enables the decay phase for the peak signal Peak (by closing the feedback path, i.e., connecting the output of the multiplexer 47 to the output of the second comparator unit 42) when it determines a zero-crossing, unless a certain pre-set number of samples of the signals has not yet been reached (the watchdog function being that of counting the samples and closing the feedback path only if a maximum limit has been reached). In this way, it is for example possible to filter anomalous oscillations of the processed signals, at least within a certain pre-set number of samples.

Returning now to the digital electronic interface circuit of FIG. 27, the selector block 38 receives at input the peak signal Peak and the configurable values of the lower threshold $Th_1$ and of the upper threshold $Th_2$, and as a function of these values generates the selection signal Sel to determine the signal to be sent at output from the multiplexer unit 34, according to the recombination algorithm described previously.

In particular, in the case where the value of the peak signal Peak is comprised between the lower threshold $Th_1$ and the upper threshold $Th_2$, the selection signal Sel selects the mixing signal M for the output of the multiplexer unit 34. In the case where the peak signal Peak is lower than the lower threshold $Th_1$, the selection signal Sel selects the first filtered detection signal N (appropriately attenuated) for the output of the multiplexer unit 34. Otherwise, in the case where the peak signal Peak is higher than the upper threshold $Th_2$, the selection signal Sel selects the second filtered detection signal H for the output of the multiplexer unit 34.

The output of the Peak circuit 36 can also be weighted so that it as determinative of the selection, but is only one factor in making the final selection and other criteria are also considered along with considering the respective values of the other input signals, Th1 and Th2. Further, the Peak signal can be increased in value or decreased by an amplifier or weighting factors inside the peak circuit 36 to modify its effect on the circuit.

Figure 4A:
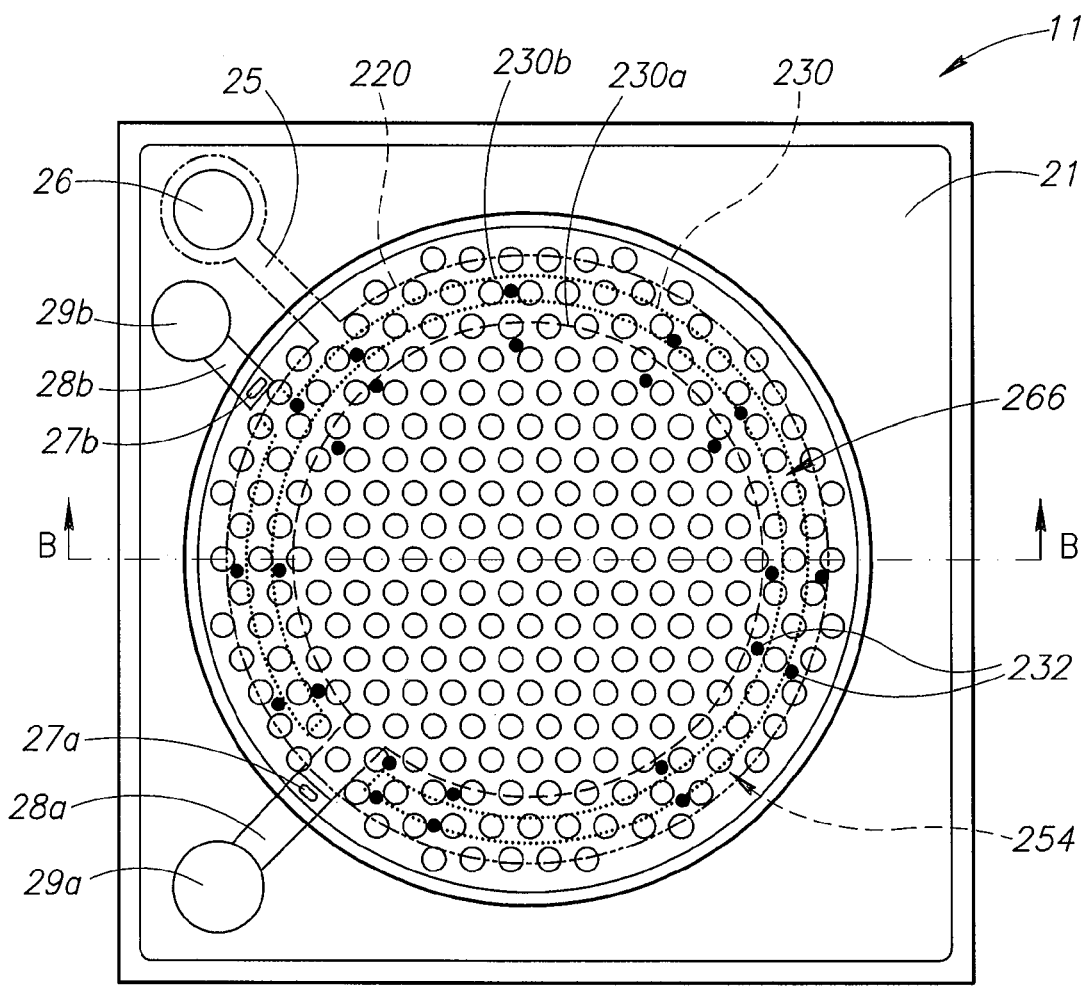
FIGS. 4A and 4B are a plan view and a cross-sectional view, which show a schematic configuration of an acoustic sensor in a MEMS microphone according to another embodiment of the present disclosure.
Figure 4B:
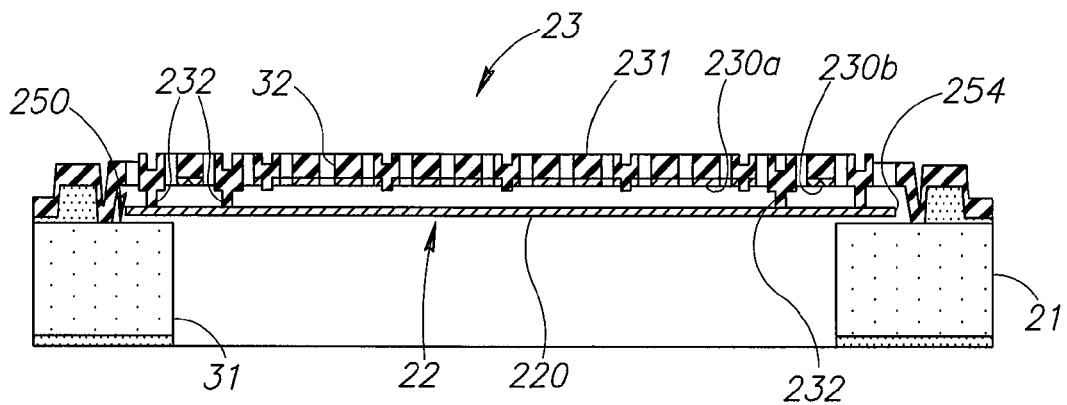

Next, a description is made of another embodiment of the present disclosure with reference to FIGS. 4A and 4B. FIGS. 4A and 4B show a schematic configuration of an alternative embodiment of the acoustic sensor 11; where FIG. 4A is a top plan view of the acoustic sensor 11, and FIG. 4B is an enlarged cross-sectional view of the acoustic sensor 11, taken along line B-B of FIG. 4A.

The acoustic sensor 11 shown in FIGS. 4A and 4B is different from the acoustic sensor 11 shown in FIGS. 1A and 1B in that the insulating layer 30 is not present, the edge 254 of a vibrating membrane 22 is not fixed to a semiconductor substrate 21, and protruding portions 232 extend from a protecting membrane 231 of a fixed membrane 23 to the vibrating membrane 22. The protruding portions 232 are coupled to the vibrating membrane 22 and support the vibrating membrane from above, in this configuration. In some package arrangements, the acoustic sensor 11 will be in a different arrangement. For example, the membrane may be above the fixed electrode 230, such that this embodiment would be upside down compared to what is shown.

The protruding portions 232 are provided so as to be apart from each other and coupled to the membrane near the second electrode 230b. The acoustic sensor 11 shown in FIGS. 4A and 4B is similar to the acoustic sensor 11 shown in FIGS. 1A and 1B in other components. Note that the same reference numerals are denoted to components having similar functions to those of the components described in the above embodiment.

The vibrating membrane 22 is not fixed to the semiconductor substrate 21. However, upon application of a voltage between the vibrating membrane 22 (vibrating electrode 220) and the fixed electrodes 230a, 230b, the vibrating membrane 22 is held by the protruding portions 232 by electrostatic forces. Therefore, influences from an external stress and an internal stress applied to the vibrating membrane 22 are reduced. Moreover, the protruding portions 232 restrict vibrations of a peripheral portion of the vibrating membrane 22. Accordingly, it is possible to reduce a detection sensitivity of a second capacitor 260 which is made of the second electrode 230b and the peripheral portion of the vibrating electrode 220. As a result, it is possible to further increase a sensitivity difference between the detection sensitivity of the first capacitor 258 and the detection sensitivity of the second capacitor 260.

During a resting state, where no voltage is supplied to the fixed electrodes 230a, 230b or the membrane, the membrane 22 rests on the top surface 250 of the substrate. When a voltage is applied, a charge is produced that attracts the membrane to the protruding portions 232.

In other embodiments, the membrane may be formed to be fixedly attached to the protruding portions.

Figure 5:
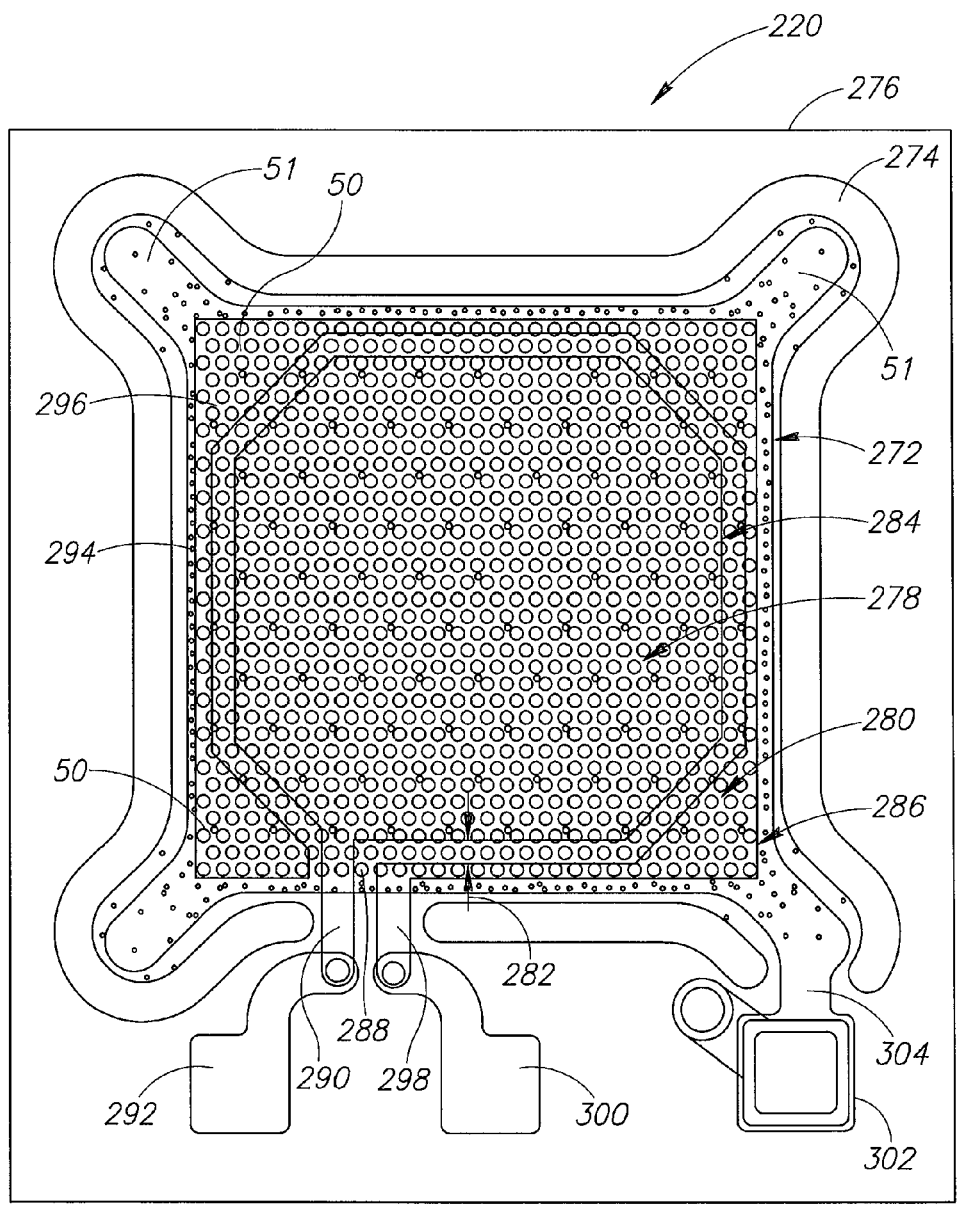
FIG. 5 is a plan view showing a schematic configuration of an acoustic sensor in a MEMS microphone according to still another embodiment of the present disclosure.
Figure 6:
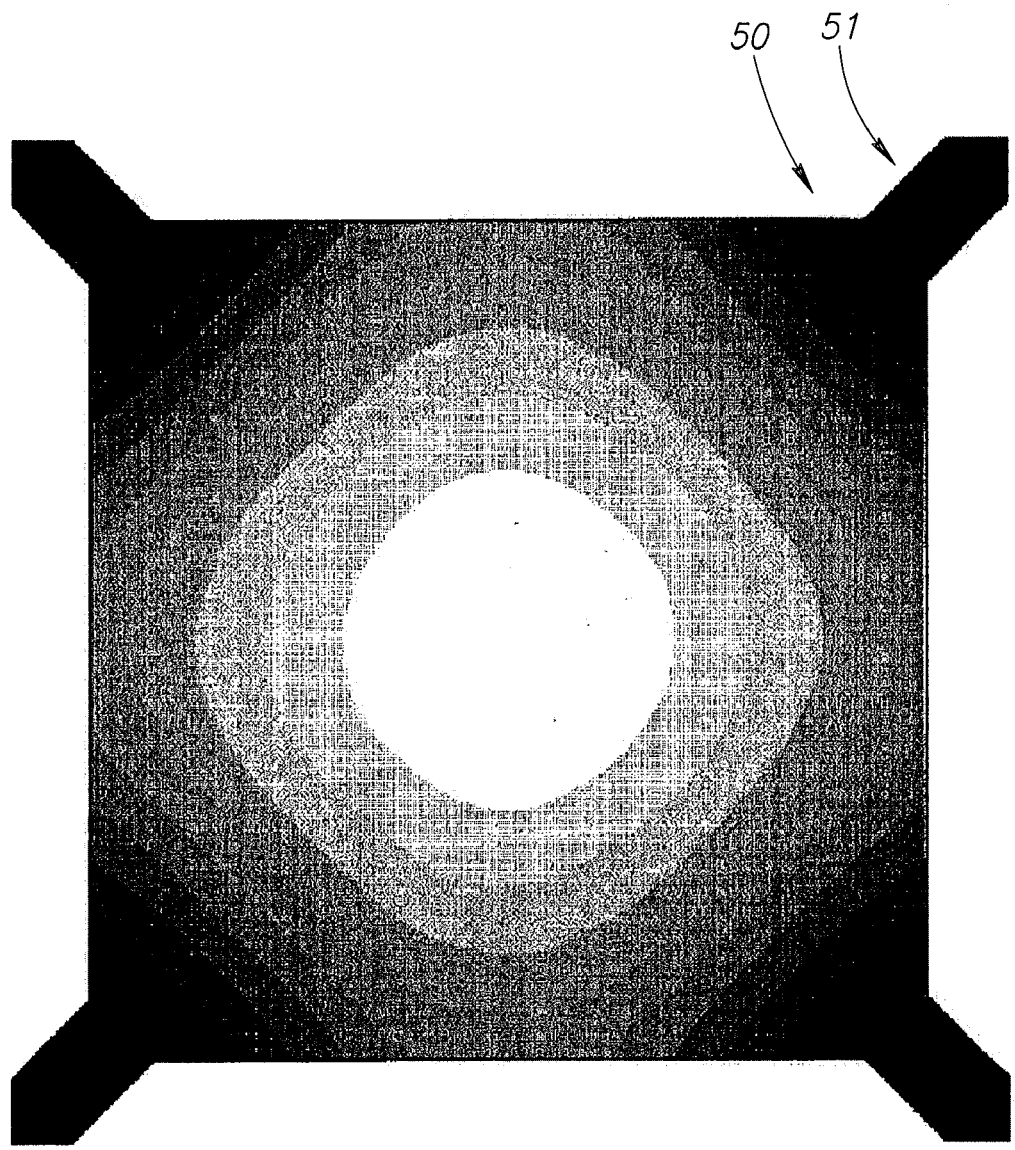
FIG. 6 is a plan view showing a vibration amount of a vibrating membrane of the acoustic sensor.

Next, a description is made of still another embodiment of the present disclosure with reference to FIGS. 5 and 6. FIG. 5 is a plan view showing an acoustic sensor 270 according to this embodiment. The plan view of FIG. 5 is a view of a vibrating membrane 272 not covered by a protecting membrane. Locations 274 where the protecting membrane couples to a substrate 276 of the sensor 270 are shown.

The membrane 272 includes a first portion 278 centrally positioned with respect to a second portion 280. The protecting membrane is not shown; however, an outline of a first electrode 284 and a second electrode 286 coupled to the protecting membrane are shown with solid lines. The protecting membrane is a fixed membrane that is configured to hold the first and second electrodes 284 and 286 in place as the vibrating membrane 272 moves in response to sound waves. The second electrode 286 surrounds the first electrode 284 on all sides, except for an opening 288 where a first extension 290 extends from the first electrode to couple the first electrode to a contact pad 292.

The acoustic sensor shown in FIG. 5 is different in the shape of the vibrating membrane 22 from the acoustic sensor shown in FIGS. 1A and 1B, and therefore, is different therefrom also in the shape of the fixed membrane. Note that other components of the acoustic sensor 11 shown in FIG. 5 are similar to those of the acoustic sensor shown in FIGS. 1A and 1B. The membrane has a generally square shape with elongated extended portions 51 from corners of the square. A width of the membrane is wider than a width of the second electrode. The protecting membrane is wider than the membrane, with the second electrode positioned towards a center of the protecting membrane. The first electrode being within the second electrode.

The second electrode 286 is separated from the first electrode by an insulator having a width 282. The insulator may be a dielectric material or air. The first electrode 284 forms a first capacitor with the first portion 278 of the membrane and second electrode 286 forms a second capacitor with the second portion 280. In this embodiment, the first electrode is an octagon while the second electrode has elongated rectangular sides 294 connected at triangular corners 296. The triangular corners 296 have a larger surface area and are positioned over the second portion of the membrane, which has less movement than the first portion.

The vibrating membrane 22 of the acoustic sensor 11 shown in FIGS. 1A and 1B is circular and has the edge portion fixed to the substrate 21. On the other hand, as shown in FIG. 5, the vibrating membrane 272 of the acoustic sensor of this embodiment has a base portion having a substantially square shape having corner portions 50 each extending outward from a center of the vibrating membrane 272, so that the vibrating membrane 272 is fixed to the semiconductor substrate 276 at such extended portions 51.

The second electrode 286 has a second extension 298 that extends from the second electrode to couple the second electrode to a contact pad 300. The membrane 272 is coupled to a contact pad 302 through an extension 304 from one of the corner portions 50.

FIG. 6 shows an amount that the vibrating membrane 272 vibrates, which is observed when a predetermined sound wave reaches the vibrating membrane 272. In FIG. 6, a region which vibrates a larger amount is shown to be brighter, or more white. As shown in FIG. 6, the vibrating membrane 272 vibrates a small amount in the corner portions 50 and the extended portions 51. Thus, as shown in FIG. 5, the fixed first and second electrodes 284, 286 are together substantially square. The center portion serves as the first electrode 284, and the corner portions 50 and connection portions by which the corner portions are connected to each other serve as the second electrode 286. As such, no matter the shape of the vibrating membrane 272, the first electrode 284 is formed so as to be facing the center region of the vibrating membrane 272, and the second electrode 286 is formed so as to be facing the vicinity of a region of the vibrating membrane 272 at which the vibrating membrane is fixed to the semiconductor substrate 21.

In this embodiment, the base portion of the vibrating membrane 272 is square. This allows effective use of an upper area of a rectangle or square chip. Moreover, in comparison with the vibrating membrane 22 in which the base portion is circular, the vibrating membrane 272 having the square base portion allows for a variety of ways in which the fixed portion may be arranged to fix the vibrating membrane 272 and the semiconductor substrate 276 to each other. Accordingly, the detection sensitivity can be varied as well. Moreover, in comparison with the vibrating membrane 22 in which the base portion is circular, the vibrating membrane 272 having a square base portion deforms in a substantial plate shape and substantially in parallel with the fixed membrane upon arrival of the sound wave at the vibrating membrane 272. The variable capacitor functions as a capacitor similar to a parallel plate capacitor, which is made of electrodes disposed at an interval being variable depending on a sound pressure. As a result, a change of the capacitance has good linearity with respect to the sound pressure.

Returning to FIG. 27, the first sensing structure 2a may correspond to the first portion 278 of the vibrating membrane 272 and the second sensing structure 2b may correspond to the second portion 280.

Figure 7:
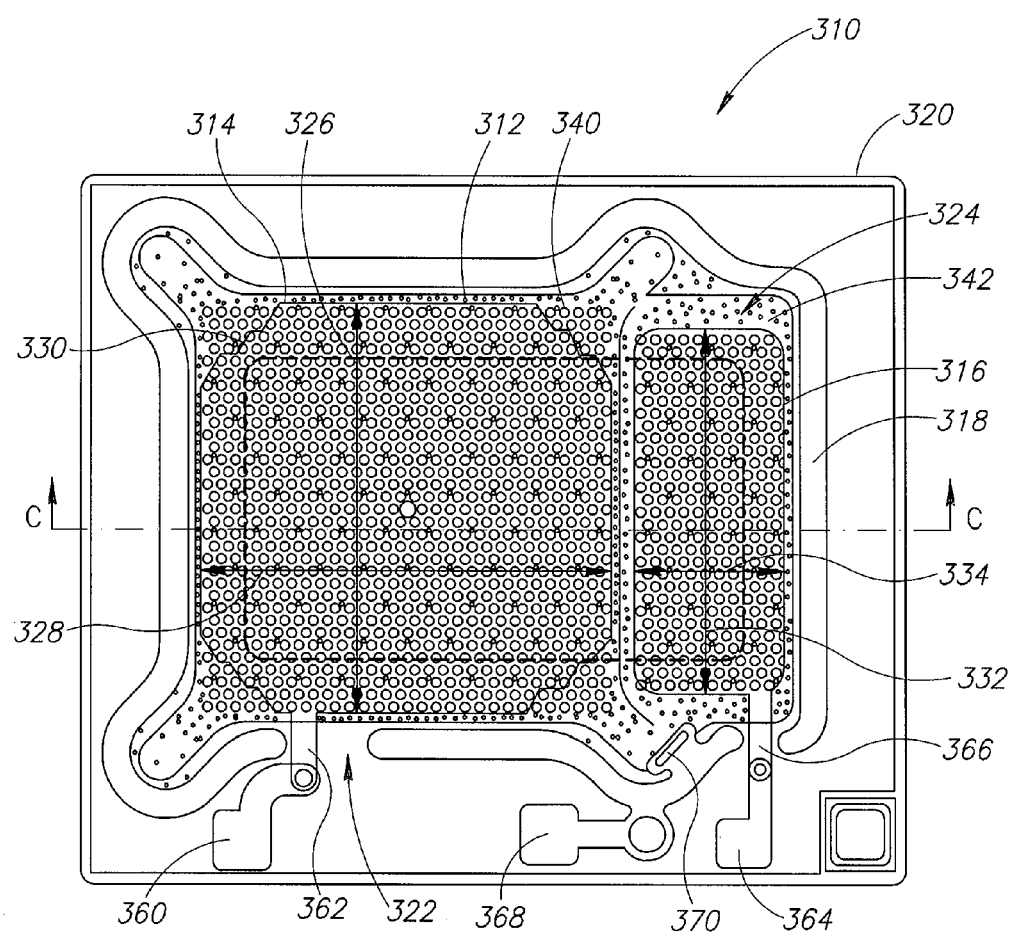
FIG. 7 is a plan view showing a schematic configuration of an acoustic sensor in a MEMS microphone according to still another embodiment of the present disclosure.
Figure 8:
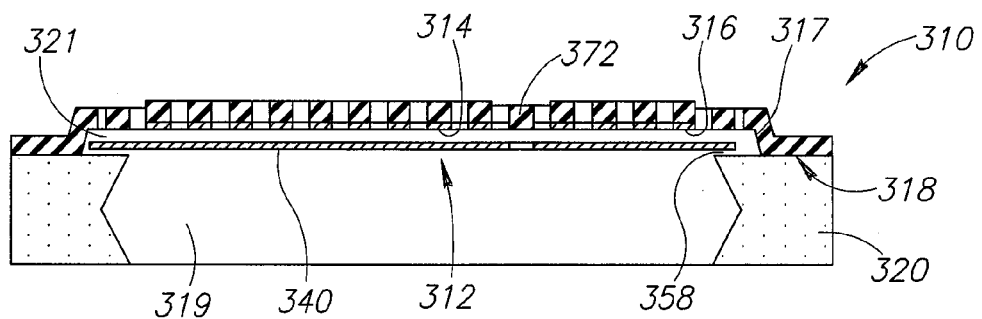
FIG. 8 is a cross-sectional view of the acoustic sensor of the present disclosure.
Figure 9:
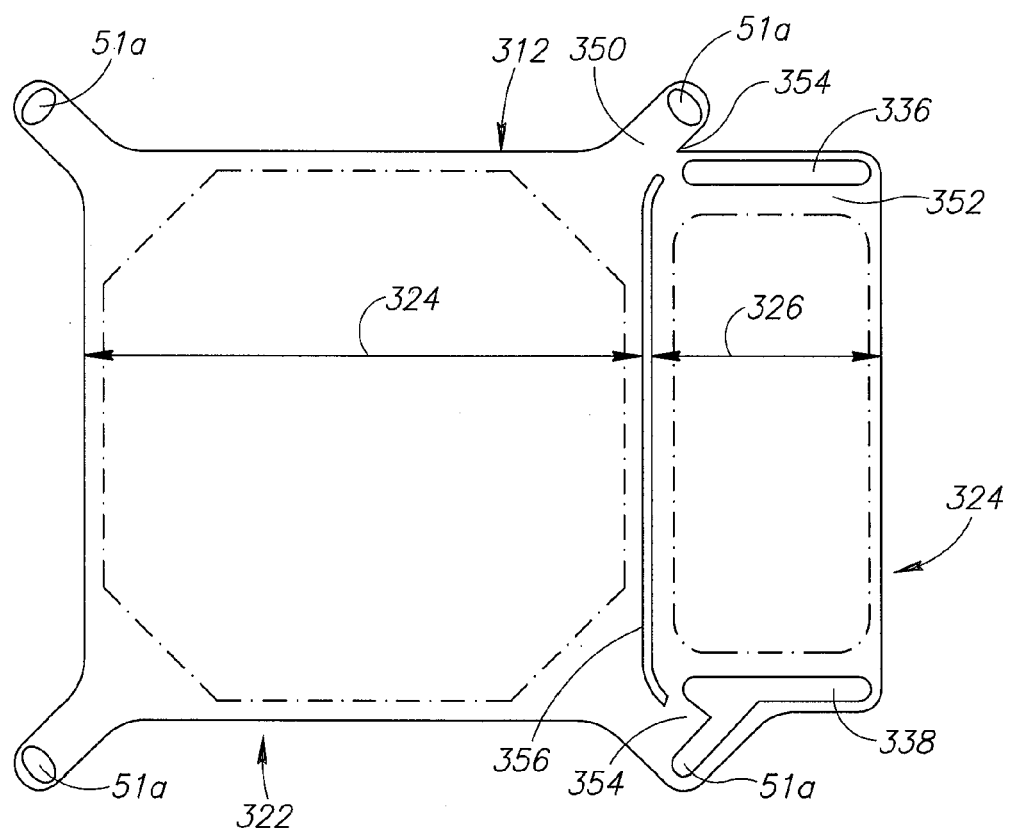
FIG. 9 is a plan view showing a schematic configuration of a vibrating membrane in the acoustic sensor of the present disclosure.
Figure 10:
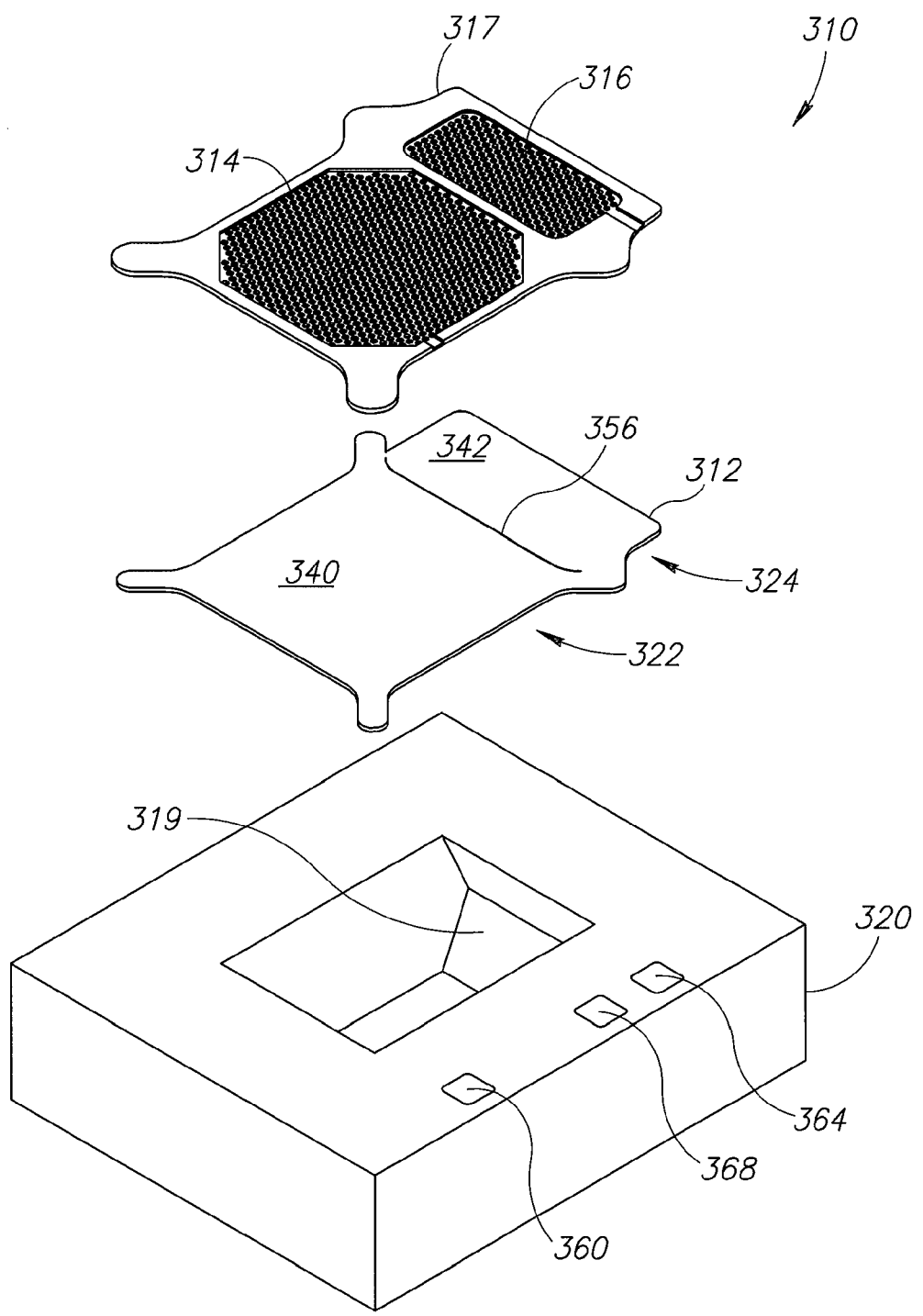
FIG. 10 is an exploded assembly view of the acoustic sensor of the present disclosure.

A description will be made of still another embodiment of the present disclosure with reference to FIG. 7 to FIG. 12. FIG. 7 is a plan view showing a schematic configuration of an acoustic sensor 310 according to this embodiment, and FIG. 8 is a cross-sectional view of the acoustic sensor 310, taken along line C-C of FIG. 7. FIG. 9 is a plan view showing a schematic configuration of a vibrating membrane 312 in the acoustic sensor 310 of this embodiment. FIG. 10 is an exploded view of the acoustic sensor 310 according to this embodiment. Note that, in FIG. 7, only an outline of a first electrode 314 and a second electrode 316 are shown. A location 318 where a protecting membrane 317 attaches to a substrate 320 is also shown. There is a chamber or opening 319 in the substrate, aligned with respect to the membrane 312. The protecting membrane provides support for the first and second electrodes that are fixed to a surface of the protecting membrane that faces the vibrating membrane 312.

The acoustic sensor 310 shown in FIGS. 7 to 10 is different from the acoustic sensor 310 shown in FIG. 5 in that the vibrating membrane 312 and the second electrode are extended sideward from a base portion 322. The first electrode forms a first capacitor with a first portion 340 of the membrane 312 and the second electrode forms a second capacitor with a second portion 342 of the membrane 312.

The first electrode 314 is associated with the base portion 322, which is square in shape and larger than a peripheral portion 324. The second electrode 316 is associated with the peripheral portion 324. The first electrode has a first dimension 326 which is the same as a second dimension 328. In other embodiments, the first and second dimension will be different. At corners of the first electrode, edges 330 are stepped such that the overall all shape is octagonal.

The second electrode 316 is rectangular in shape and has a first dimension 332 and a second dimension 334. The first dimension is larger than the second dimension in this embodiment. In an alternative embodiment, the first dimension and the second dimension of the second electrode may be equal or more similar in dimension. The first dimension 332 of the second electrode is smaller than the first dimension 326 of the first electrode 314. This is a result of many factors, such as anchoring regions 336 and 338 shown in FIG. 9. It is beneficial to have different dimension so that the electrodes return different signals, i.e., they have different sensitivities.

Returning to FIG. 27, the first sensing structure 2a may correspond to the first portion 340 of the vibrating membrane 312 and the second sensing structure 2b may correspond to the second portion 342.

In FIG. 9, a first dashed line represents the first electrode 314 which is electrically isolated from the second electrode 316 (see the second dashed line). The first electrode and the second electrode each have their own separate electrical connections to the respective contact pads, 360, 364. An isolation bridge 323 is positioned between the first electrode 314 and the second electrode 316 (see FIG. 10). The isolation bridge 323 is a dielectric material that is positioned above the boundary region 372.

In the vibrating membrane 312, the base portion 322 is wider than the peripheral portion 324. More particularly, a width 346 of the base portion is larger than a width 348 of the peripheral portion (see FIG. 9). Moreover, in the vibrating membrane 312, the base portion is fixed at fixed portions 51a on tips of respective extended portions 350, and the peripheral portion is fixed at anchoring regions 336 in respective edge portions 352 in upper and lower sides (when seen in FIG. 9).

The extended portions 350 extend from four corners of the base portion of the membrane 312. The extended portions have a consistent width and a rounded tip. The two extended fixed portions 51a closest to the peripheral portion 324 merge with the edge portions 352 at points 354. The base portion 322 is separated from the peripheral portion 324 by a slit or opening 356. In this embodiment, the slit has a linear central region and curved outer portions. The outer portions curve away from a center of the base portion 322 and towards the peripheral portion. The curvature is slight. In addition, the slit separates the extended portions 350 from the edge portions 352 at the points 354. This slit is visible in FIG. 7; however, due to the complexity of the Figure, the dimensions and features of the slit are less clear. FIG. 9 is an enhanced view of the slit 356.

The edges of the vibrating membrane 312 have unfixed portions, which serve as gaps 358 (vent holes with respect to the substrate 320). In FIG. 8, the membrane 312 is suspended because the cross-sectional line does not pass through one of the anchors 51a. The vibrating membrane 312 is configured such that a ratio of an area of the fixed portions 51a of the base portion with respect to an area of the base portion is smaller than a ratio of an area of the anchoring regions 336 of the peripheral portion with respect to an area of the peripheral portion. Accordingly, this causes the base portion to be displaced more than the peripheral portion. In the example of FIG. 9, the fixed portion 51a and the anchoring region 338 on the lower right-hand side of the image are connected to each other.

In FIG. 7, the first electrode 314 is coupled to a contact pad 360 through an extension 362. The second electrode 316 is coupled to a contact pad 364 through an extension 366. The membrane 312 is coupled to another contact pad 368 through a connection 370 positioned adjacent to the fixed portion 51a and the anchoring region 338.

Figure 11:
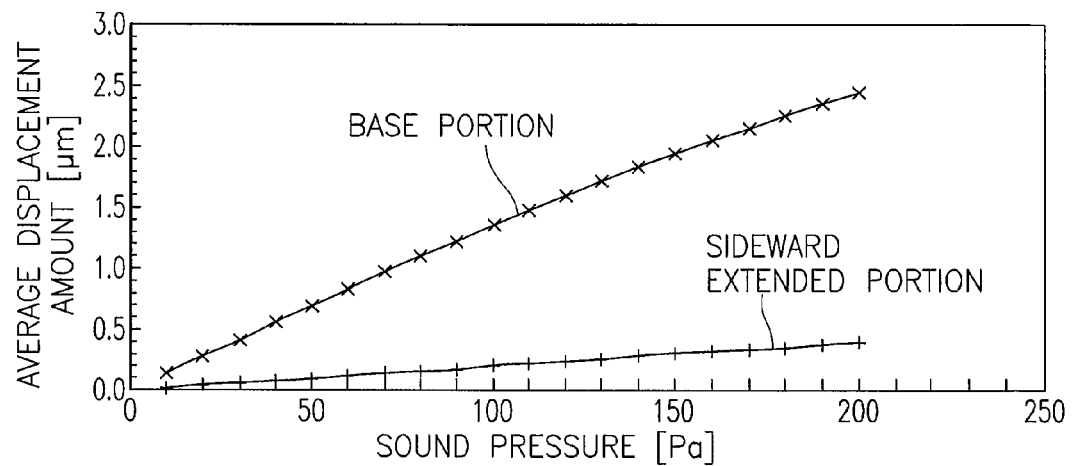
FIG. 11 is a graph showing a change of an average displacement amount of the vibrating membrane with respect to a sound pressure applied to the vibrating membrane in the acoustic sensor of the present disclosure.

FIG. 11 shows a graph illustrating a change of an average displacement amount of each portion of the vibrating membrane 312 in response to the sound pressure applied to the vibrating membrane 312. Note that a unit of the sound pressure is Pa, and that a unit of the average displacement amount is μm. Referring to FIG. 11, it can be understood that the base portion has a larger average displacement amount than the peripheral portion. Hence, the base portion of the vibrating membrane 312 and of the first electrode 314 form a variable capacitor which functions as a high-sensitivity capacitor capable of favorably detecting a small sound.

The graph in FIG. 11 shows that a graph line representing the average displacement amount of the base portion in response to the sound pressure inclines at a constant degree until the sound pressure reaches 120 Pa, but declines at gradually decreasing degrees when the sound pressure exceeds 120 Pa. On the other hand, a graph line representing the average displacement amount of the sideward extended portion in response to the sound pressure inclines at a constant degree until the sound pressure reaches 200 Pa. Hence, the peripheral portion of the vibrating membrane 312 and the second electrode forms a variable capacitor which functions as a low-sensitivity variable capacitor capable of favorably detecting a large sound.

Furthermore, the vibrating membrane 312 has a slit 356 formed so as to be facing a boundary region 372 between the first electrode 314 and the second electrode 316. Since the slit 356 is formed only in a part of the vibrating membrane 312 that faces the boundary region 372, the base portion and the peripheral portion are physically and electrically connected to each other.

Incidentally, in the case where the slit 356 is not formed, the base portion and the peripheral portion are adjoined with each other, and accordingly, the displacement of the base portion and the displacement of the peripheral portion affect each other. As opposed to this, in this embodiment, since the slit 356 is formed, the base portion and the peripheral portion are separated from each other, which results in a more significant difference between the displacements of the base portion and the peripheral portion.

Moreover, in the case where the opening 319 and the air gap 321 have different air pressures, the air flows from the opening 319 to the air gap 321 through the slit 356, or vice versa, which reduces the difference between the air pressures of the opening 319 and the air gap 321. Hence, it is possible to reduce a variation of the characteristics of the acoustic sensor 310 that is caused by the changes of the air pressure, and also to reduce a variation of the characteristics, noise and the like, caused by changes of an external fluid such as noise by a wind.

Note that, if a width of the slit 356 is too wide, then a ventilation effect is intensified, and an amount of the air going through the slit 356 becomes too large, which may result in a drop of a roll-off frequency that deteriorates the low-frequency characteristics. A description is made below of this point in detail.

Figure 12:
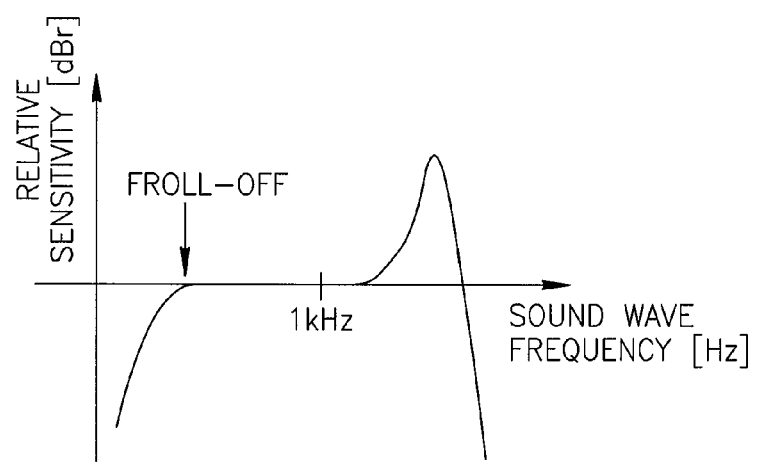
FIG. 12 is a graph showing typical frequency characteristics in the MEMS microphone of the present disclosure.

FIG. 12 shows typical frequency characteristics of the MEMS microphone. A vertical axis in FIG. 12 represents a frequency (unit: Hz) of the sound wave, and a horizontal axis represents a relative sensitivity (unit: dBr). In a range where a graph line is horizontal, the relative sensitivity does not depend on the frequency of the sound wave, and therefore the sound wave can be detected favorably. A lower limit frequency in this range is a roll-off frequency $C_{roll-off}$.

In general, the roll-off frequency $f_{roll-off}$ depends on an acoustic resistance $R_{venthole}$ of the ventilation hole and a compliance of the air (air spring constant) $C_{backchamber}$ in the back chamber (opening 31), and is represented by the following expression.

$$f_{roll-off} \propto 1/(R_{venthole} \times C_{backchamber}) \quad (1)$$

The acoustic resistance $R_{venthole}$ becomes smaller as a width of the slit becomes larger, although the acoustic resistance $R_{venthole}$ is also affected by a length of the slit 356. Hence, in accordance with the expression (1), the roll-off frequency $f_{roll-off}$ becomes larger, so that the low frequency characteristics are deteriorated. For example, if the width of the slit 356 is 1 μm, then the roll-off frequency $f_{roll-off}$ is 50 Hz or less; however, if the width of the slit 356 is 10 μm, then the roll-off frequency $f_{roll-off}$ is no less than 500 Hz. Therefore, if the width of the slit 356 exceeds 10 μm, the flow frequency characteristics are remarkably deteriorated, and the sound quality is impaired. Hence, it is desirable that the width of the slit 356 be 10 μm or less.

Figure 13:
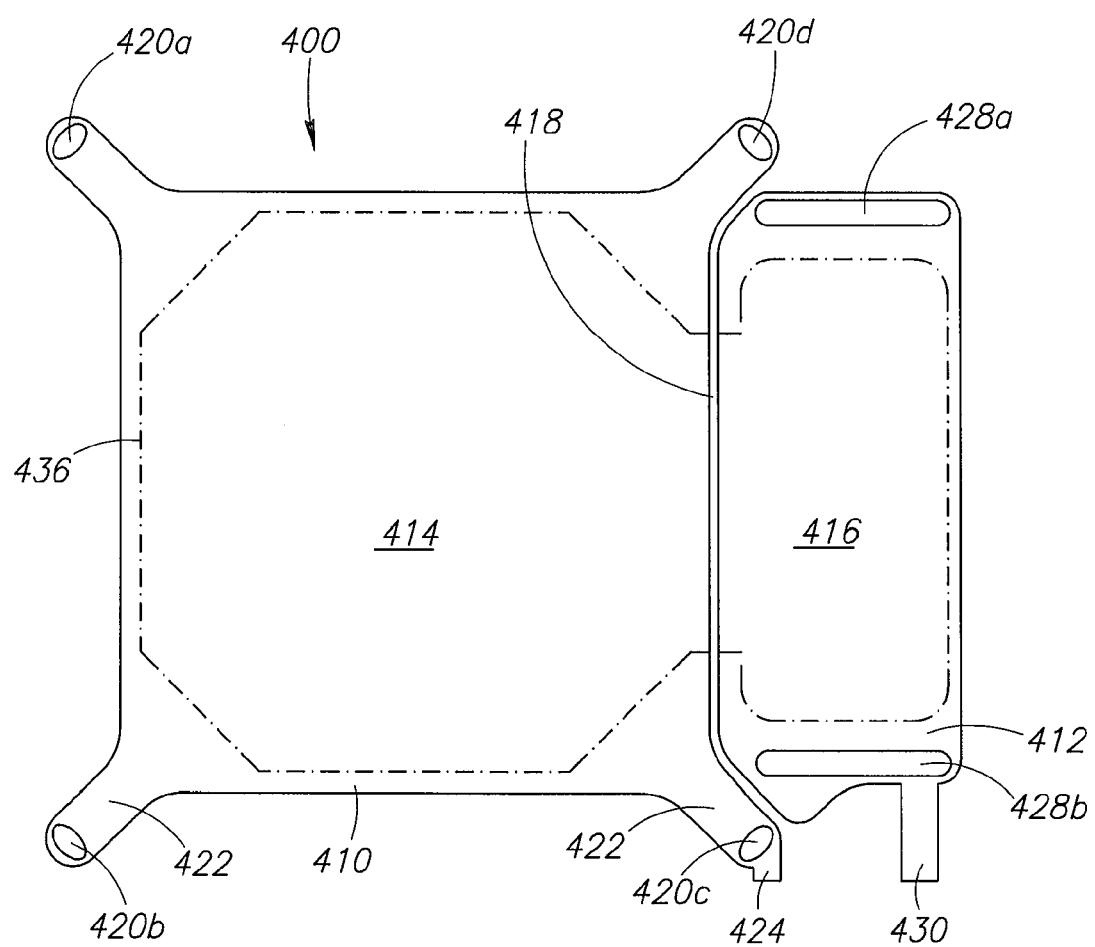
FIG. 13 is a plan view showing a schematic configuration of a vibrating membrane in an acoustic sensor of a MEMS microphone according to another embodiment of the present disclosure.
Figure 14:
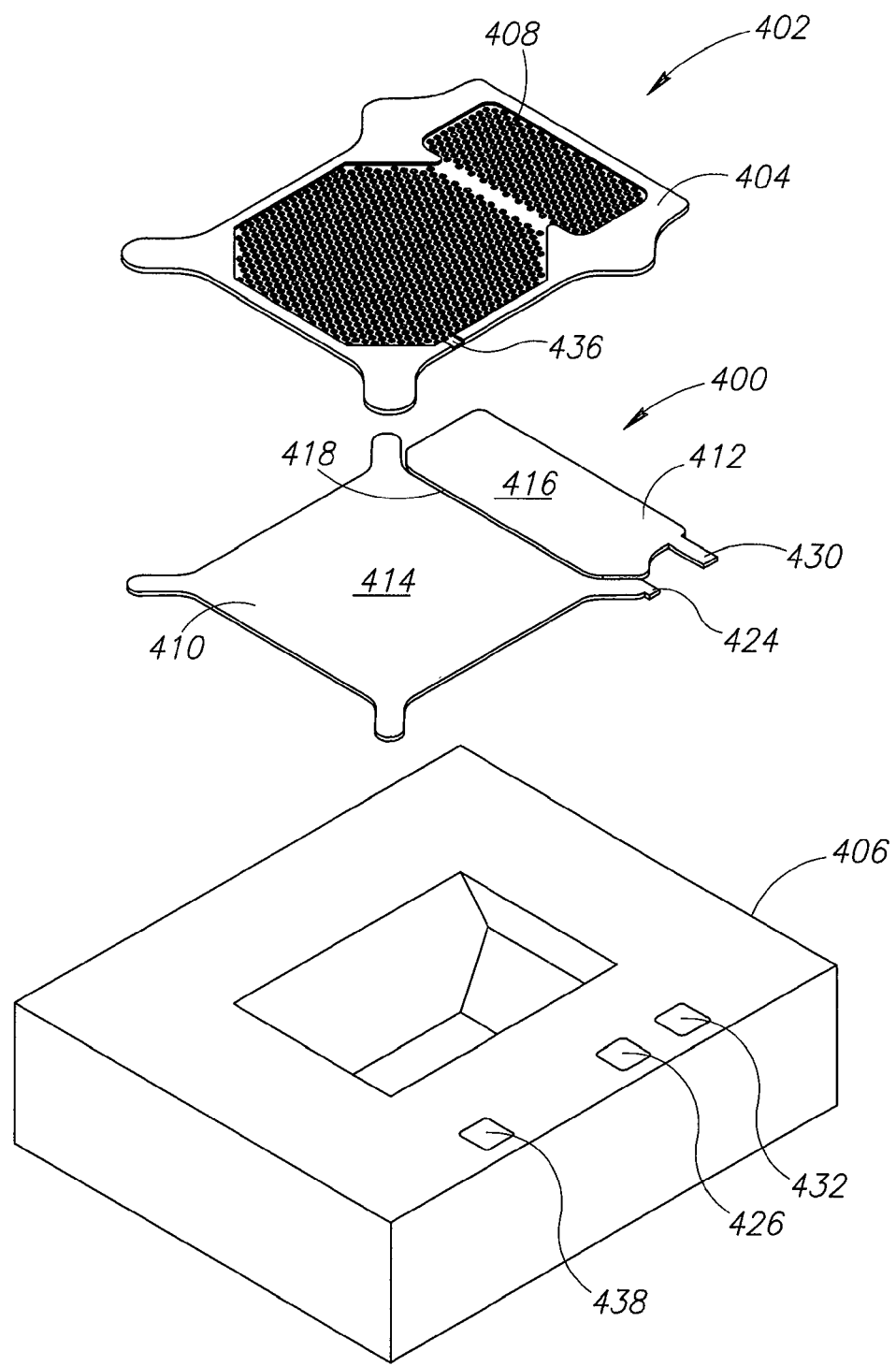
FIG. 14 is an exploded assembly view of the acoustic sensor of the present disclosure.

Next, a description will be made of another embodiment of the present disclosure with reference to FIG. 13 and FIG. 14. FIG. 13 is a plan view showing a schematic configuration of a vibrating membrane 400 in an acoustic sensor 402 according to this embodiment, and FIG. 14 is an exploded assembly view of the acoustic sensor 402 with a protecting membrane 404 and a substrate 406 according to this embodiment.

The acoustic sensor 402 of this embodiment is different from the acoustic sensor 310 shown in FIGS. 7-10 in that the first electrode 314 and second electrode 316 are connected to each other or are one electrode 408. The vibrating membrane 400 is divided into a first electrode 410 and a second electrode 412. The first electrode is associated with a base or main portion 414 and the second electrode 412 is positioned to the side of the base portion, i.e., the second electrode is a peripheral portion 416. The first electrode 410 is separated completely from the second electrode 412 of the membrane 400 by an opening 418.

The first electrode 410 of the membrane 400 is fixed to the substrate 406 by anchoring regions 420a, 420b, 420c, and 420d. In this embodiment, the first electrode is nearly symmetrical along a center axis. The anchoring regions are all the same size and shape, which is a very small portion of the overall surface area of the first electrode. The anchoring regions are as far from the center of the first electrode of the membrane as possible, which allows the membrane to have more significant movement in response to a sound wave. In this embodiment, the anchoring regions are ovals whose width is nearly as wide as a width of extensions 422 of the first electrode.

The extensions 422 extend away from a corner of the first electrode by a distance that is less than a quarter of the longest dimension of the first electrode. The anchoring region 420c includes a connection 424 to electrically couple the first electrode 410 to a contact pad 426 on the substrate 406.

The second electrode 412 is an elongated rectangular shape that is nestled against a right-most edge of the first electrode 410. The opening 418 separates and isolates the second electrode from the first electrode. A width of the opening 418 remains constant along a linear portion (vertically oriented in FIG. 13 between the first electrode 410 and the second electrode 412. The opening follows a shape of the first electrode as the extensions 422 move away from a central portion of the first electrode. The width of the opening may increase slightly as the opening moves away from the linear portion toward the anchoring regions, such as region 420d and 420c.

The second electrode includes a top anchoring region 428a and a bottom anchoring region 428b. The top and bottom anchoring regions are elongated ovals that have a longer longest dimension than the anchoring regions 420 of the first electrode. The anchoring regions fix a top and bottom portion of the second electrode to restrict movement to generate a different sensitivity in this electrode as compared to the first electrode.

Along the top of the second electrode, an upper left-most edge is like a clipped edge of a rectangle or a folded corner of a piece of paper that matches a slope of the edge of the extension 422 of the first electrode. Along the bottom of the second electrode, a bottom left-most edge has a different shape, with a ridge or bump that protrudes away from the anchoring region 428b. There is also a connection 430 that is configured to electrically connect the second electrode to a contact pad 432 on the substrate. In this embodiment, the first electrode and the second electrode of the membrane 400 can be held at different potentials.

A dashed line 434 corresponds to a shape of the electrode 408 of the protecting membrane 404. The protecting membrane 404 includes a connection 436 configured to electrically connect the electrode 408 to a contact pad 438 on the substrate. The substrate 406 has the same arrangement of the contact pads as previous embodiments. The arrangement of the vibrating membrane with respect to the protecting membrane can be varied without changing the arrangement of the contact pads. This will minimize or prevent changes to an ASIC configured to be used in conjunction with such an acoustic transducer. The various combinations of the vibrating membrane with respect to the protecting membrane include a split vibrating membrane and two fixed electrodes in the protecting membrane, a split protecting membrane with a single vibrating membrane, and split protecting membranes and vibrating membranes.

The acoustic sensor 402 of this embodiment is similar to the acoustic sensor 402 shown in FIG. 7 to FIG. 10 in other components. As described above, the vibrating membrane 400 can be divided. In this case, the first electrode 410 and the second electrode 412 are connected to the amplifiers 121 and 122 of the ASIC 12 in FIG. 3.

The present disclosure is not limited to the respective embodiments mentioned above, and is modifiable in various ways within the scope described in the claims. Embodiments obtained by appropriately combining technical means individually disclosed in the different embodiments are also incorporated in the technical scope of the present disclosure.

For example, in the embodiments described above, each of the sound hole portions 32 has a cross section that is circular; however, the sound hole portions may have a cross section in any shape, such as a triangle or a quadrangle.

Moreover, in some of the embodiments mentioned above, one of the vibrating electrode and the first and second electrodes are divided into two; however, in other embodiments there may be three or more electrodes.

Returning to FIG. 27, the first sensing structure 2a may correspond to the first electrode 410 of the vibrating membrane 400 and the second sensing structure 2b may correspond to the second electrode 412. In this case, the first and second micromechanical sensing structures 2a, 2b are provided by one and the same mobile membrane, such as the vibrating membrane 400, which is appropriately separated into two electrically insulated portions, facing a respective fixed electrode so as to form two detection capacitors: a first peripheral portion 416, designed to detect high sound-pressure levels with a low sensitivity, and a central or main portion 414, which undergoes greater elastic deformations, designed to detect lower sound-pressure levels, but with a higher sensitivity.

Figure 15:
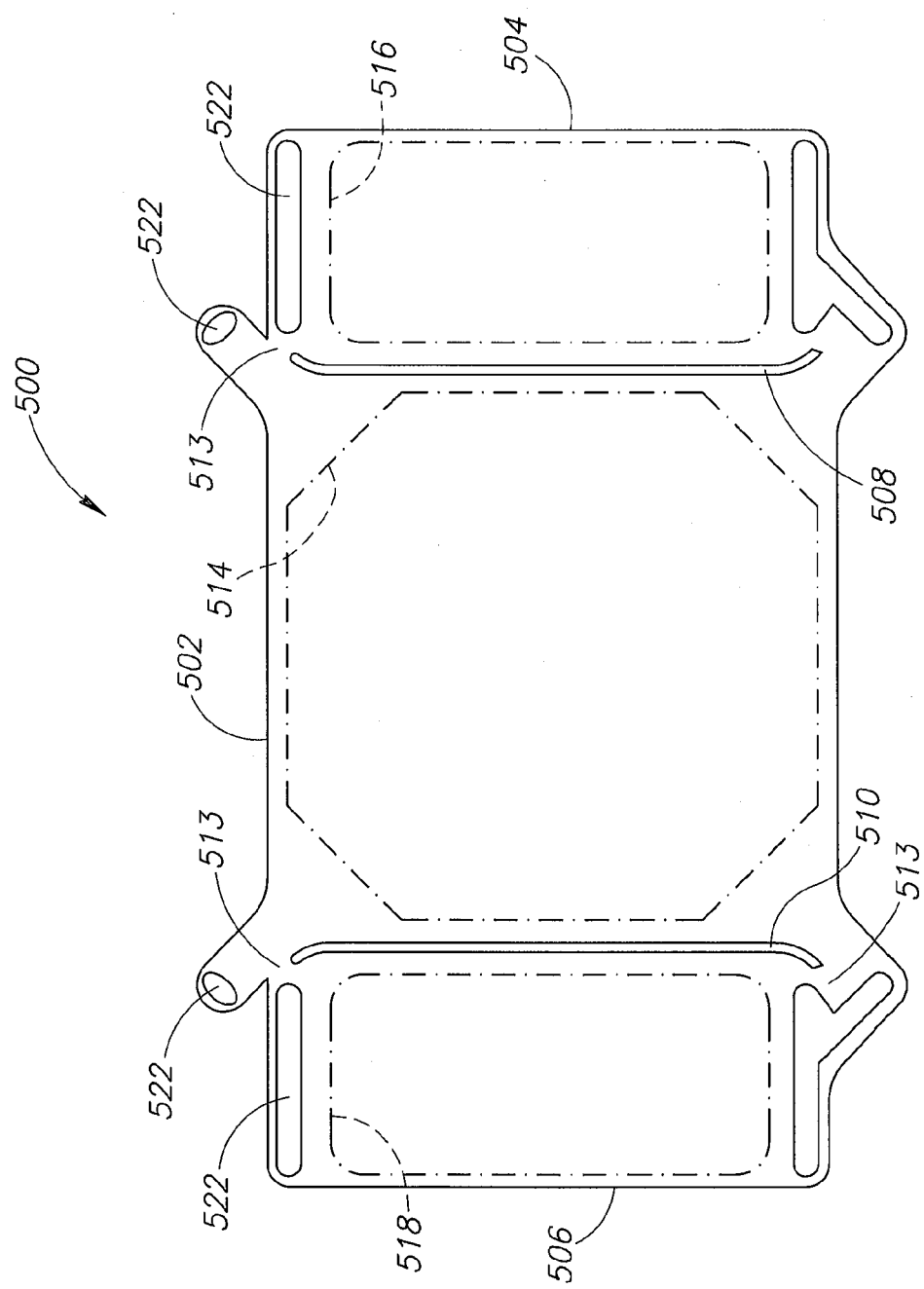
FIGS. 15-18 are alternative embodiments of an acoustic sensor of the present disclosure.
Figure 16:
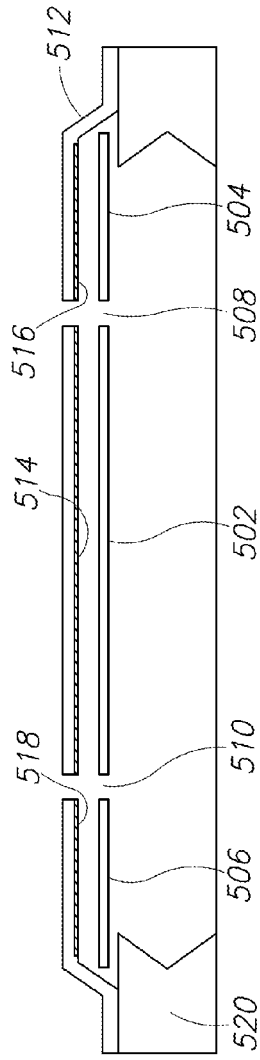

FIG. 15 is top down view of a vibrating membrane 500 formed in accordance with the present disclosure. FIG. 16 is a simplified cross-sectional view of an acoustic transducer including the vibrating membrane 500. The vibrating membrane 500 includes a first portion 502 positioned centrally, a second portion 504 positioned to the right of the first portion, and a third portion 506 positioned to the left of the first portion. The first portion and the second portion are separated by a first partial opening 508 while the first portion and the third portion are separated by a second partial opening 510. The openings allow the portions to move somewhat independently while keeping the entire membrane at the same potential.

The portions are configured to be one plate of a variable capacitor that detects changes in sound pressure. The dashed lines in the portions correspond to a position of an electrode in a protecting membrane, such as the protecting membrane 512 in FIG. 16. In particular, a first fixed electrode 514 is formed on a surface of the protecting membrane 512 that faces the vibrating membrane 500. The first electrode is configured to form a capacitor with the first portion 502 of the vibrating membrane 500. A second electrode 516 is formed as part of the protecting membrane 512 and is configured to form a capacitor with the second portion 504 of the vibrating membrane. A third electrode 518 is formed as part of the protecting membrane 512 and is configured to form a capacitor with the third portion 506 of the vibrating membrane. The first, second, and third electrodes are electrically isolated and are coupled to the substrate through separate electrical connections. Each of the capacitors will output a signal, which can be processed to provide a more accurate detection of sound pressure.

Each of the portions is electrodes of the respective capacitors; however, they are all electrically coupled through connection portions 513. The vibrating membrane 500 is fixed to a substrate 520 with anchoring regions 522. The anchoring regions 522 are similar to the anchoring regions described above.

Figure 17:
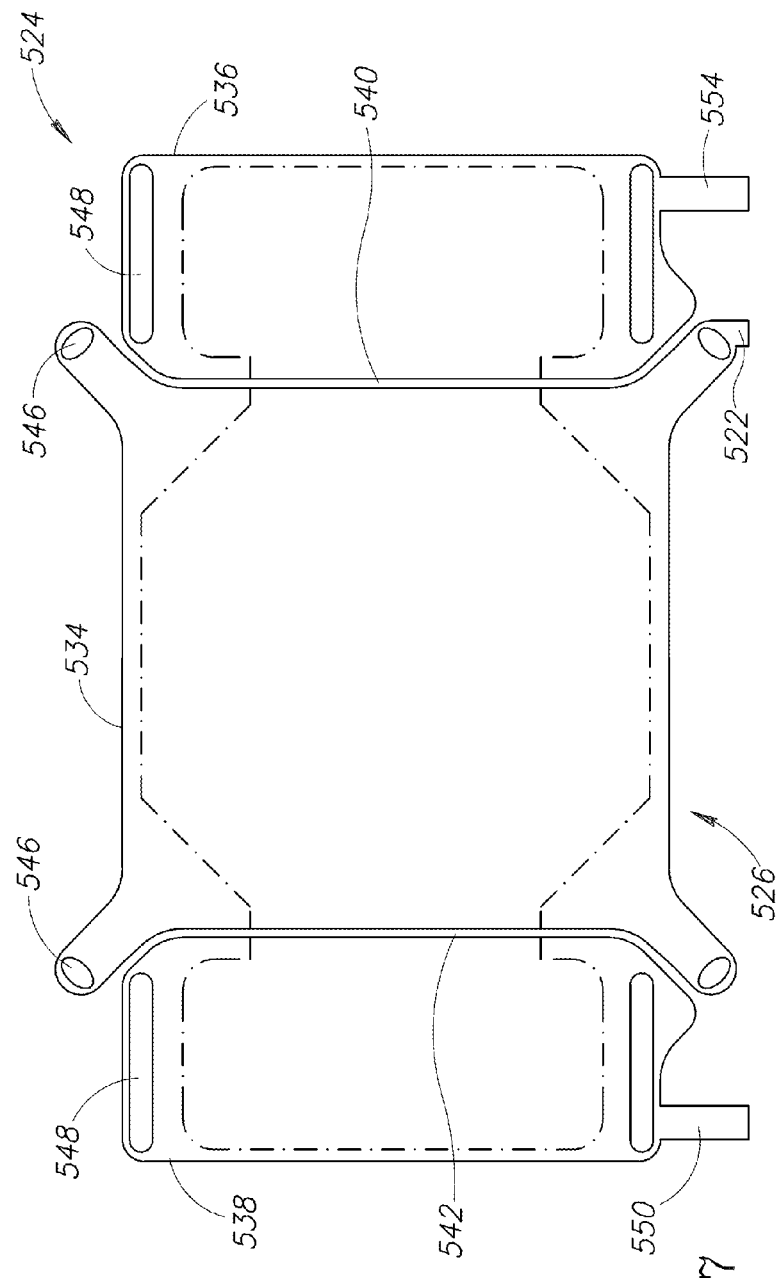
Figure 18:
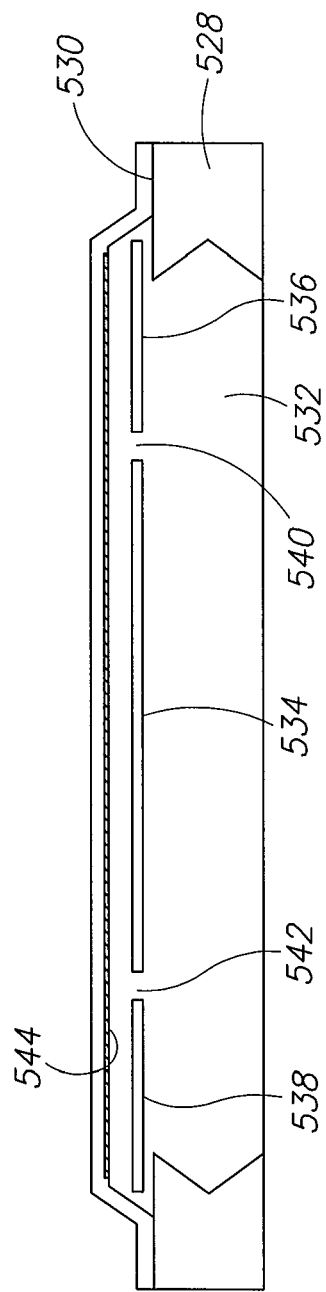

FIGS. 17 and 18 are an alternative embodiment of an acoustic transducer 524 formed in accordance with the present disclosure. The transducer includes a vibrating membrane 526 that is coupled or fixed to a substrate 528. A protecting membrane 530 is formed overlying the vibrating membrane and on the substrate 528. An opening 532 in the substrate acts as a back chamber of the acoustic transducer. In this embodiment, the protecting membrane 530 is shown as solid; however, sound holes may be formed at intervals as shown in the previous images.

The vibrating membrane 526 includes three electrodes that are isolated from each other. A first electrode 534 is a main or central electrode, which is larger than the other electrodes of the vibrating membrane 526. A second electrode 536 is positioned on one side of the first electrode and a third electrode 538 is positioned on an opposite side of the first electrode from the second. The first and second electrodes are electrically separated by a first insulator 540. The first and third electrodes are electrically separated by a second insulator 542. The first and second insulators may be air or another dielectric material.

A dashed line shown in FIG. 17 corresponds to dimensions of an electrode 544 of the protecting membrane 530. Since the electrodes of the vibrating membrane are separated, there can be a single electrode 544 in the protecting membrane.

The vibrating membrane is suspended in FIG. 18 because the cross section does not pass through any anchoring regions 546, 548. The anchoring regions may be formed in accordance with the embodiments described above.

Each electrode of the vibrating membrane has a connection that couples the electrode to a contact pad and provides the electrode with power. In particular, the first electrode 534 includes a connection 552, the second electrode 536 includes a connection 554, and the third electrode 538 includes a connection 550.

As the number of divided electrodes is increased, the number of components is increased, such as wires for transmitting signals from the divided electrodes, and electrical circuits for processing the signals in the ASIC 12. This increases the sizes of the acoustic sensor and the MEMS microphone. Hence, it is desirable that the number of divided electrodes be small, for example, two.

Moreover, both of the vibrating electrode and the fixed electrode may be divided. In this case, in response to the characteristics of the amplifiers 121 and 122 of the ASIC 12, the divided electrodes of one of the vibrating electrode and the fixed electrode are connected to the amplifiers 121 and 122, and the divided electrodes of the other of the vibrating electrode and the fixed electrode may be short-circuited to each other. Alternatively, a plurality of charge pumps 120 of the ASIC 12 may be provided, and connected to each of the divided electrodes of one of the vibrating electrode and the fixed electrode. Further, the divided electrodes of the other of the vibrating electrode and the fixed electrode may be respectively connected to the amplifiers 121 and 122.

As described above, the acoustic transducer of the present disclosure includes a substrate; a vibrating membrane provided above the substrate, including a vibrating electrode; and a fixed membrane provided above the substrate, including a fixed electrode, the acoustic transducer detecting a sound wave according to changes in capacitances between the vibrating electrode and the fixed electrode, converting the sound wave into electrical signals, and outputting the electrical signals, at least one of the vibrating electrode and the fixed electrode being divided into a plurality of divided electrodes, and the plurality of divided electrodes outputting the electrical signals.

In accordance with the above configuration, at least one of the vibrating electrode and the fixed electrode is divided into a plurality of divided electrodes, whereby the plurality of variable capacitors are formed between the vibrating electrode and the fixing electrode. This allows the plurality of divided electrodes to respectively output a plurality of electrical signals, so as to provide an acoustic transducer capable of converting the sound wave into the plurality of electrical signals.

Moreover, the plurality of variable capacitors are formed between the same vibrating membrane and the same fixed membrane. Hence, according to the present disclosure, the chips have similar variations between the detection sensitivities of the respective variable capacitors, in comparison with the conventional technique by which the pluralities of vibrating membranes and fixed membranes are provided independently. This makes it possible to reduce a variation between the chips with regard to the difference between the detection sensitivities of the variable capacitors. Moreover, the variable capacitors share the vibrating membrane and the fixed membrane. This makes it possible to reduce, in the chip, the mismatching in the acoustic characteristics such as the frequency characteristics and the phase.

Preferably, the variable capacitors have respective different detectable sound pressure levels. This allows the acoustic sensor including the plurality of variable capacitors to have an increased detectable sound pressure level, in comparison with the conventional acoustic sensor including only one variable capacitor.

In order to differentiate the detectable sound pressure levels of the respective variable capacitors from each other, at least two of the plurality of divided electrodes may be configured to have different detection sensitivities for the sound wave.

Alternatively, at least two of the plurality of divided electrodes may be configured to have respective different areas. Moreover, a region of the vibrating membrane corresponding to a larger one of said at least two of the plurality of divided electrodes which have the respective different areas vibrates, in response to the sound wave, with a greater average amplitude than a region of the vibrating membrane corresponding to a smaller one of said at least two of the plurality of divided electrodes which have the respective different areas. This allows the variable capacitors to have detectable sound pressure levels which differ from each other more greatly, thereby allowing the acoustic sensor to have further increased detectable sound pressure levels.

Moreover, where the electrode is divided into a greater number of divided electrodes, it is necessary to increase the number of components, such as wires for transmitting signals from the divided electrodes and electrical circuits for processing the signals. This increases the sizes of the acoustic sensor and the microphone. Hence, it is desirable that the number of the plurality of divided electrodes be a small number, for example, two.

Preferably, the acoustic transducer according to the present disclosure is configured such that the vibrating electrode and the fixed electrode are disposed at a certain interval. According to this configuration, since the variable capacitors are provided in the same interval between the vibrating electrode and the fixed electrode, it is possible to further reduce, in the chip, the mismatching in the acoustic characteristics. Moreover, according to this configuration, it is possible to simplify a step of forming the vibrating electrode and the fixed electrode in the manufacturing process of the acoustic transducer.

Preferably, the acoustic transducer according to the present disclosure is configured such that one of the vibrating electrode and the fixed electrode is divided into a plurality of divided electrodes. In comparison with a configuration in which both of the vibrating electrode and the fixed electrode are divided into divided electrodes, this configuration has fewer connections with an external circuit, so that productivity is enhanced. Moreover, according to this embodiment, the number of connection terminals to outside is decreased. This makes it possible to reduce a parasitic capacitance caused by the connection terminals, so as to improve the characteristics. Moreover, only a single voltage is necessary to be applied to the variable capacitors from an external charge pump. This makes it possible to reduce the size of the external circuit including the charge pump, to reduce a manufacturing cost, and to reduce a variation in the difference between the detection sensitivities, the variations being caused by variations of the external charge pumps made in their fabricating processes.

It is possible to achieve similar effects to the above, even if both of the vibrating electrode and the fixed electrode are divided into a plurality of divided electrodes, as long as the plurality of divided electrodes of one of the vibrating electrode and the fixed electrode are electrically short-circuited to each other.

Preferably, the acoustic transducer according to the present disclosure is configured such that each of the vibrating electrode and the fixed electrode has a uniform thickness. This configuration allows the chips to have more similar variations between the detection sensitivities of the variable capacitors, the variations being caused in fabrication. This makes it possible to further reduce the variation between the chips with regard to the differences in detection sensitivities of the variable capacitors.

Preferably, the acoustic transducer according to the present disclosure may be configured such that the vibrating membrane has a base portion shaped in a rectangle or square. Accordingly, this configuration allows effective use of an upper area of the chip. Moreover, in comparison with the vibrating membrane having a circular base portion, the vibrating membrane having the square base portion allows the fixed portion via which the vibrating membrane and the substrate are fixed to each other to change in more various ways. This makes it possible to change the detection sensitivity variously. Moreover, in comparison with the vibrating membrane having the circular base portion, the vibrating membrane having the square base portion deforms in a substantial plate shape and substantially in parallel with the fixed membrane upon arrival of the sound wave at the vibrating membrane. Therefore, the variable capacitor functions as a capacitor similar to a parallel plate capacitor, which is made of electrodes disposed at an interval being variable depending on a sound pressure. As a result, a change of the capacitance has good linearity with respect to the sound pressure.

The acoustic transducer according to the present disclosure may be configured such that the vibrating membrane has a base portion shaped in a circle. In comparison with the vibrating membrane having the base portion shaped in a rectangle or a square, the vibrating membrane having the base portion shaped in a circle can reduce stress concentrated thereto. This makes it possible to enhance durability against an external stress and an internal stress.

Preferably, the acoustic transducer according to the present disclosure is configured such that the vibrating membrane has an extended portion extended outward from the base portion, and the vibrating membrane is fixed to the substrate or the fixed membrane at the extended portion. In this configuration, it is possible to increase a displacement amount of the vibrating membrane.

The acoustic transducer according to the present disclosure may be configured such that when the vibrating electrode is divided into a plurality of divided electrodes, the vibrating membrane has a slit which is formed in a boundary region between the plurality of divided electrodes; and in a case where the fixed electrode is divided into a plurality of divided electrodes, the vibrating membrane has a slit which is formed so as to face a boundary between the plurality of divided electrodes. The slit increases a difference in displacement amounts of parts of the vibrating membrane, which parts correspond to the respective variable capacitors, thereby making it possible to increase the difference between the detection sensitivities of the variable capacitors. Moreover, the slit allows the air to go in and out therethrough. This makes it possible to control changes of the air pressure caused by the vibration of the vibrating membrane, thereby making it possible to reduce a variation of the characteristics caused by the changes of the air pressure.

Preferably, the acoustic transducer of the present disclosure is configured such that the slit has a width of 10 μm or less. This makes it possible to prevent significant deterioration of low frequency characteristics.

Preferably, the acoustic transducer according to the present disclosure is configured such that the vibrating membrane and the substrate are separated by a gap. In comparison with a configuration in which a gap is not present, this configuration makes it possible to increase a displacement amount of the vibrating membrane, thereby improving the detection sensitivity. Moreover, even if the substrate is warped by external force and the like, the vibrating membrane in such a configuration is less likely to be warped, and accordingly, the acoustic characteristics are less likely to be varied. Moreover, this configuration makes it possible to reduce an influence by variations of an outside air pressure.

The acoustic transducer according to the present disclosure is configured such that the vibrating membrane has a plurality of regions corresponding to the plurality of divided electrodes, and at least two of the plurality of corresponding regions have their respective fixed portions at which the vibrating membrane is fixed to the substrate or the fixed membrane; and a ratio of an area of one of said at least two of the plurality of corresponding regions with respect to an area of its respective fixed portion is different from a ratio of an area of the other of said at least two of the plurality of corresponding regions with respect to an area of its respective fixed portion.

In general, the displacement of the vibrating membrane changes depending on how the fixed portions are formed. For example, as the number of fixed portions increases, the vibrating membrane is displaced in response to sound pressure in a smaller amount and accordingly the detection sensitivity becomes smaller. Hence, in the above configuration, since the plurality of variable capacitors have different area ratios, the plurality of variable capacitors have different detection sensitivities.

The acoustic transducer according to the present disclosure is configured such that the substrate has an opening facing a center of the vibrating membrane, and the sound wave enters the acoustic transducer through the opening. According to this configuration, the opening is shared by the variable capacitors. Therefore, it is possible to further reduce, in the chip, the mismatching in the acoustic characteristics such as the frequency characteristics and phases. Moreover, in comparison with a configuration in which the sound wave enters the acoustic transducer through the fixed membrane, this configuration makes it possible to reduce deteriorations of the sensitivity and the frequency characteristics due to a volume effect of the opening.

Note that it is possible to achieve similar effects to the above by a microphone including the acoustic transducer having the above configuration, and an integrated circuit (IC) that supplies power to the acoustic transducer and amplifies electrical signals from the acoustic transducer to output the electrical signals to outside.

As described above, in the acoustic transducer according to the present disclosure, at least one of the vibrating electrode and the fixed electrode is divided, whereby the plurality of variable capacitors will be formed between the vibrating electrode and the fixed electrode. Accordingly, such an effect is achieved that the acoustic transducer can be realized, which is capable of converting the sound wave into a plurality of electrical signals by outputting the plurality of electrical signals from the plurality of divided electrodes, respectively.

Moreover, the plurality of variable capacitors are formed in the same vibrating membrane and fixed membrane. Accordingly, such effects are achieved that the variations among the chips with regard to the differences in detection sensitivity among the variable capacitors are suppressed, and that the mismatching in the chip with regard to the acoustic characteristics such as the frequency characteristics and the phase is suppressed.

As described above, in accordance with the acoustic transducer according to the present disclosure, the acoustic transducer capable of converting the sound wave into the plurality of electrical signals is realized in the same vibrating membrane and fixed membrane. Accordingly, since the variation of the acoustic characteristics can be suppressed, the acoustic transducer according to the present disclosure can be applied to an arbitrary MEMS-type acoustic sensor.

Figure 19:
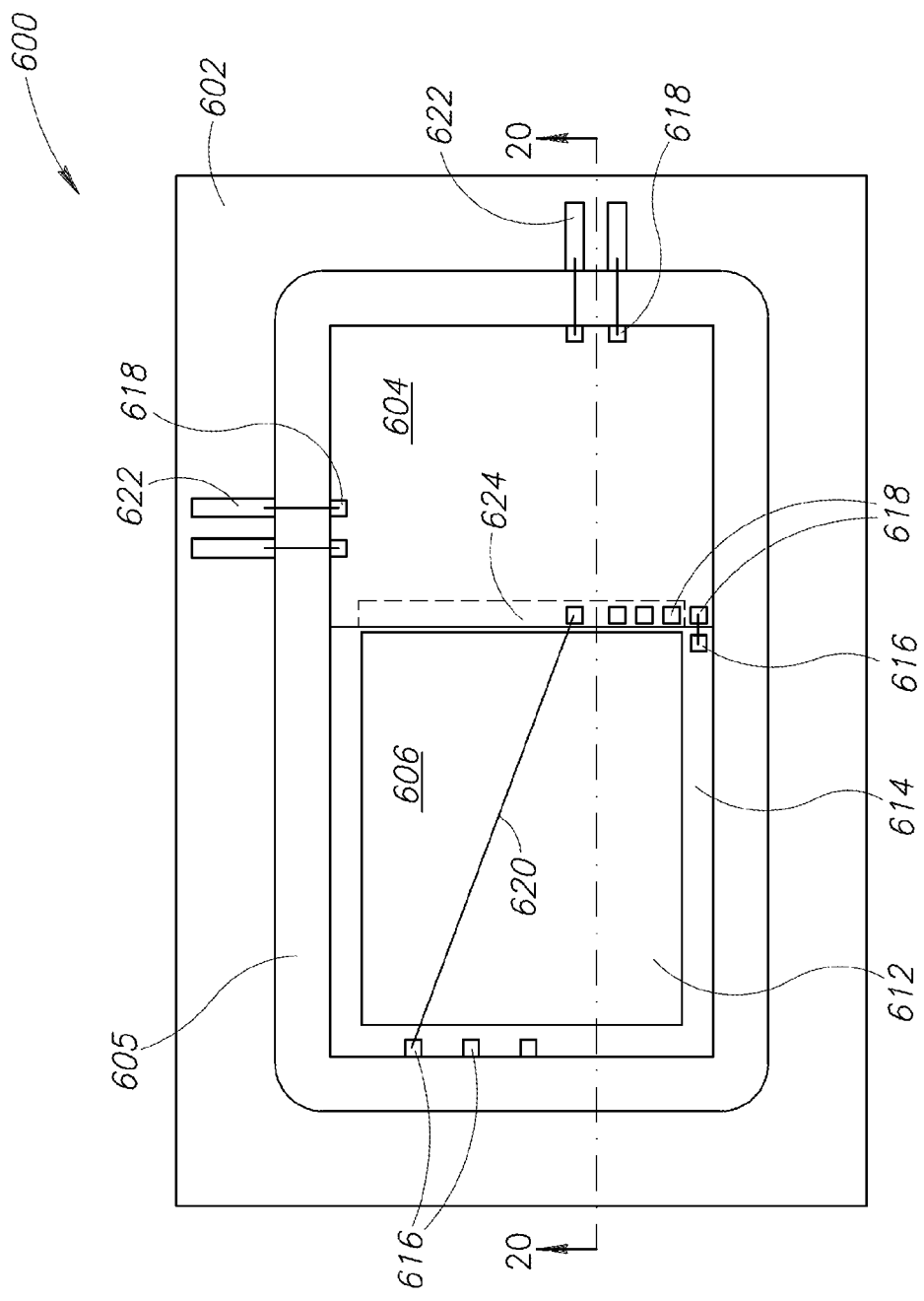
FIG. 19 is a top plan view of a package including an acoustic sensor of the present disclosure.
Figure 20:
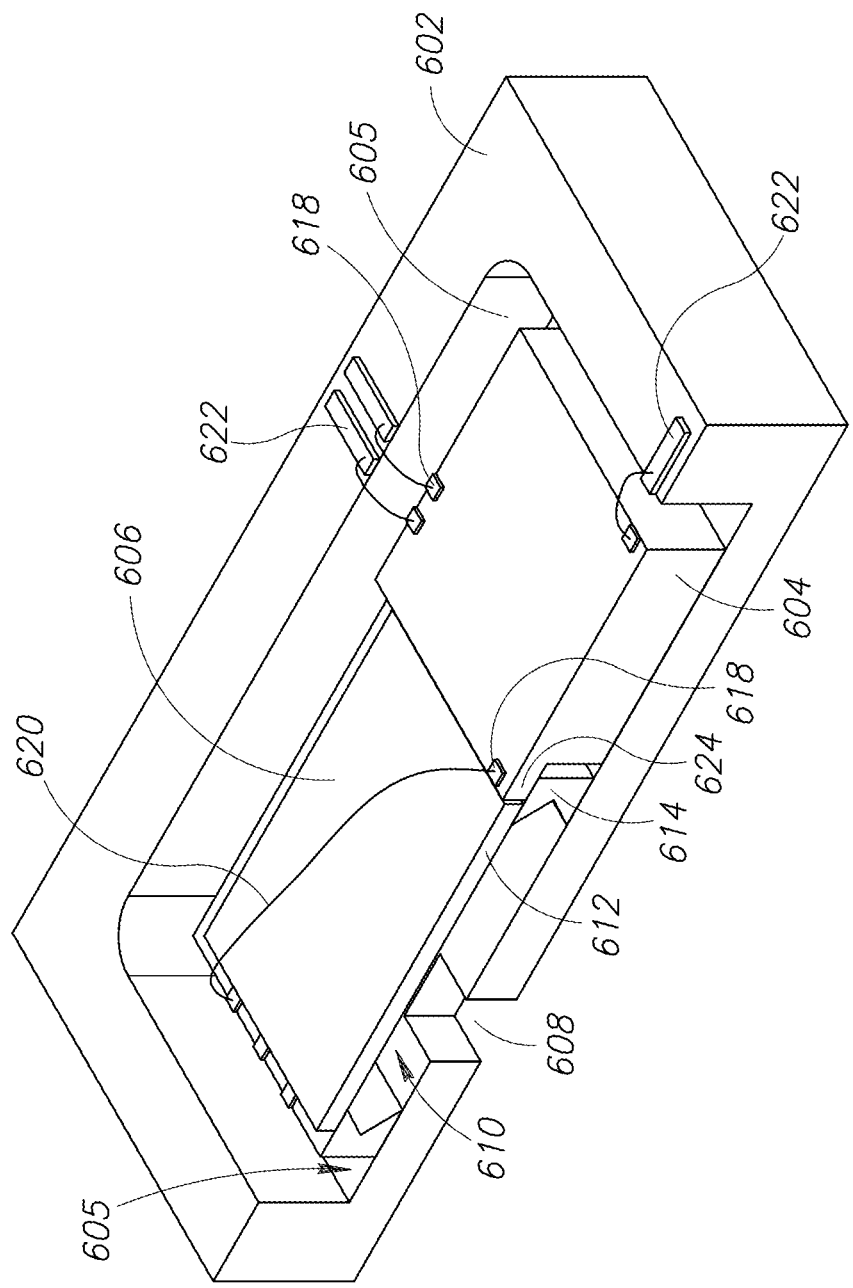
FIG. 20 is a cross-sectional view of the package of FIG. 19 taken through 20-20 of the present disclosure.

FIGS. 19 and 20 are a top down view of and a cross-sectional view through 20-20 of a package 600 formed in accordance with the present disclosure. The package 600 includes a housing 602 with an interior chamber 605. An ASIC 604 is adjacent to a MEMS die 606 in the chamber 605. The housing 602 includes an opening 608. The MEMS die 606 is a microphone and is positioned to cover the opening 608. The opening 608 is configured to allow sound waves to enter a back chamber 610 of the microphone such that a vibrating membrane, not shown, can detect the sound waves.

The microphone includes a protecting membrane 612 positioned on a substrate 614. Various contact pads 616 are formed on the substrate around edges of the protecting membrane. The ASIC 604 includes a plurality of contact pads 618 on a top surface. Some of the contact pads 616 are coupled to contact pads 618 by wires 620. Other contact pads 622 may be formed on a top surface of the housing 602. Others of the contact pads 618 of the ASIC are coupled to the contact pads 622 on the housing 602 and provide electrical connection to external components, such as a printed circuit board in a mobile phone.

The ASIC 604 includes an overhang 624 that overlaps and covers a part of the MEMS die 606. The shaped die for the ASIC 604 allows the die to be positioned more closely together while shortening the distance to couple the contact pads 618 on the ASIC with the contact pads 616 on the MEMS.

Figure 21:
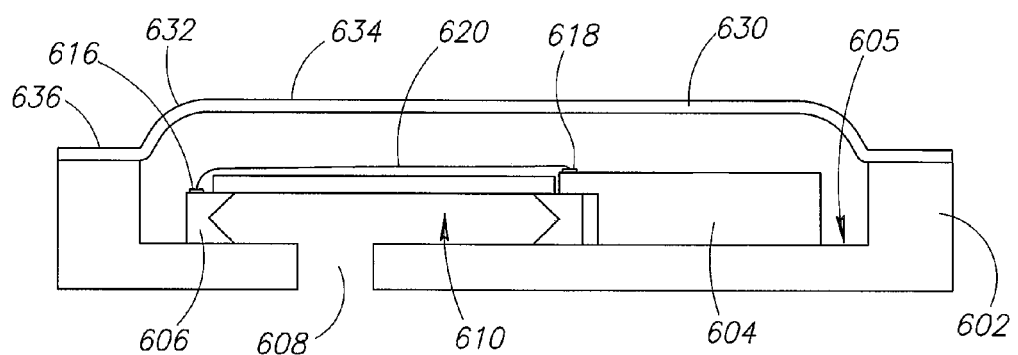
FIG. 21 is a cross-sectional view of the package of FIG. 19, including a cap of the present disclosure.

FIG. 21 is a front cross-sectional view of the housing 602 in FIG. 20 including a metal cap 630. The cap 630 has curved side portions 632 that connect a top portion 634 to side connection portions 636. The cap 630 forms a metal shielded cavity package once the cap is coupled and fixed to the housing by gluing or otherwise adhering the connection portions 636 to a top surface of the housing. The glue or adhesive may be conductive to achieve a ground connection.

Figure 22:
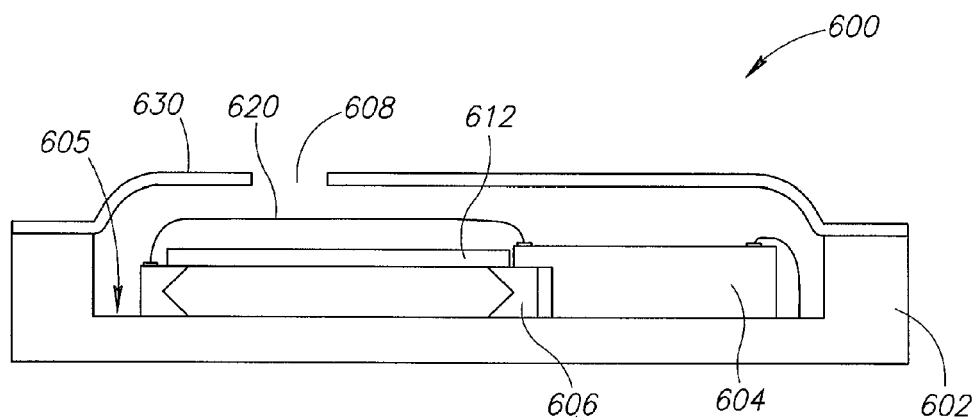
FIGS. 22-26 are alternative packages arrangements in accordance with the present disclosure.

FIGS. 22-28 are alternative arrangements of the MEMS die 606 and the ASIC 604 in the package 600. In FIG. 22, the housing 602 is solid and does not include the opening 608 described above; however, the MEMS die 606 and the ASIC 604 are positioned on the lower surface of the chamber 605 in the same arrangement as in FIGS. 19-22. Instead, the opening 608 is in the metal cap 630 positioned directly above the MEMS die 606. In this arrangement, sound waves will first pass through the protecting membrane 612, such as through sound holes, which are not shown in this view. The sound waves will then hit the vibrating membrane and be detected by the capacitors.

Figure 23:
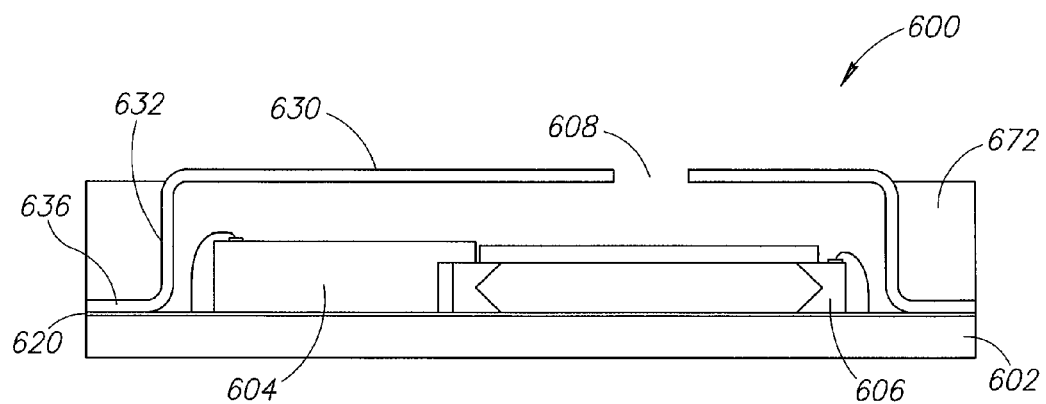

FIG. 23 is an alternative arrangement of the package 600 that includes a flat version of the housing 602, which is a planar substrate. An adhesion layer 670 is formed on the housing 602 prior to attaching the ASIC or the MEMS die.

The cap 630 has longer side portions 632 such that the cap 630 rests on the flat housing instead of on the raised edges of the housing. The connection portions 636 adhere to or are otherwise bonded to the adhesion layer 670. The side portions 632 are covered by an encapsulant 672 that is formed only around the side portions of the metal cap 630. This over molding with encapsulating provides mechanical anchoring that reduces a likelihood of breaking the seal of the package. A top portion 634 of the cap remains exposed and the opening 608 is through this top portion.

Figure 24:
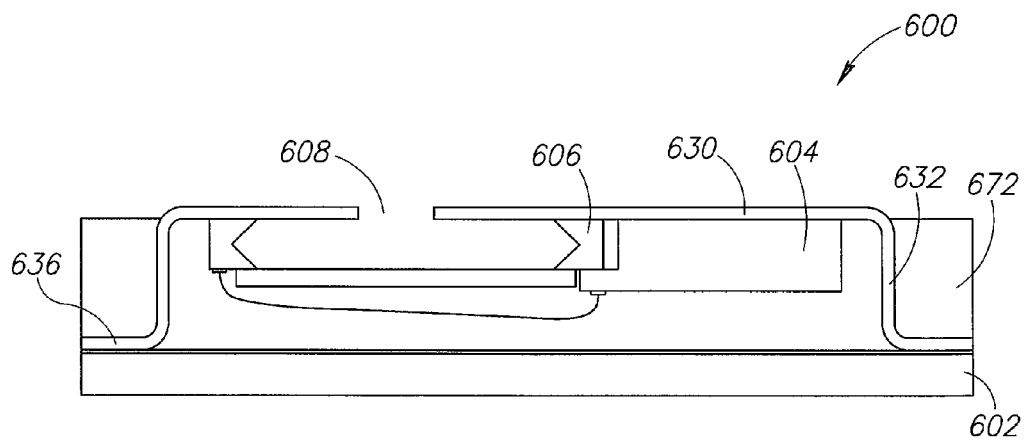

FIG. 24 is another alternative embodiment of the package. The package 600 is similar to the package in FIG. 23; however, the MEMS die 606 and the ASIC die are attached to the metal cap 630. The MEMS die 606 is positioned in line with the opening 608 in the metal cap 630. Although not shown, it is possible that the ASIC die be attached to the housing 602 while the MEMS die 606 is attached to the cap, or vice versa.

Figure 25:
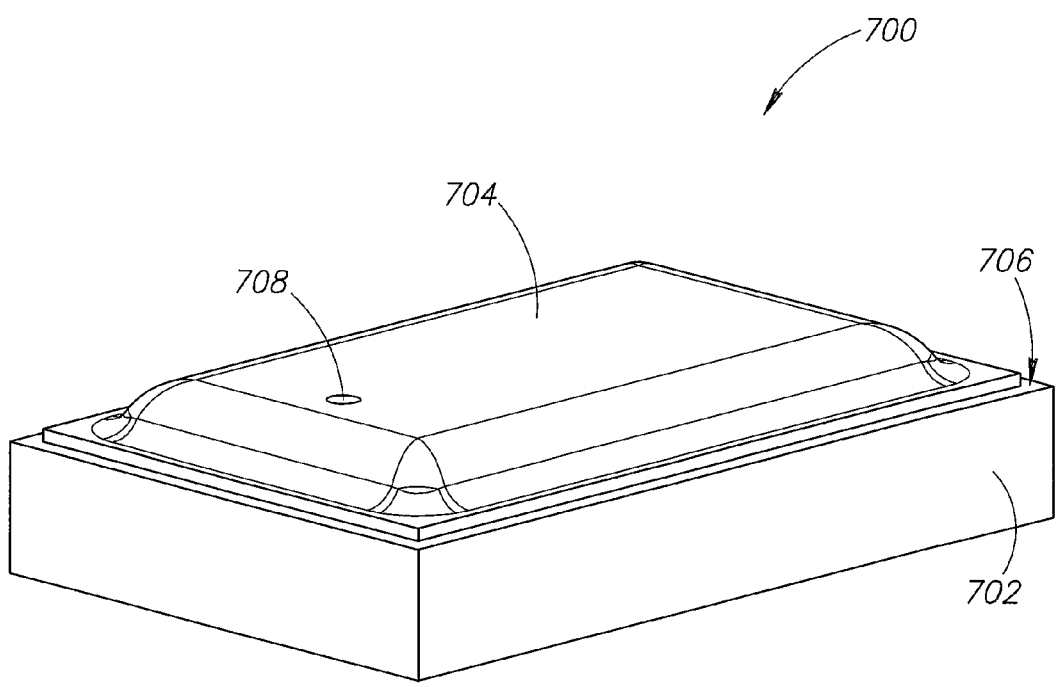
Figure 26:
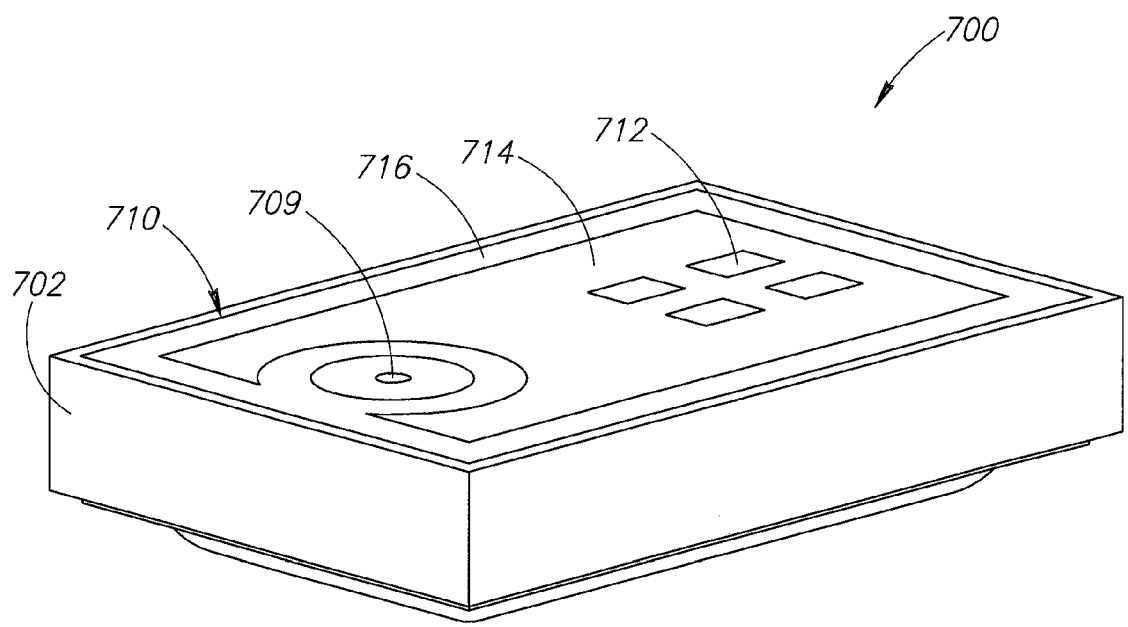

FIGS. 25 and 26 are top and bottom views of alternative embodiments of a package 700 formed in accordance with the present disclosure. The package 700 includes a housing 702, which may contain a cavity as discussed above with respect to FIG. 19 that includes a MEMS die and an ASIC die. The package 700 includes a cap 704 coupled to a top surface 706 of the housing 702.

In FIG. 25, an opening 708 is provided in the cap 704. In contrast, in FIG. 26, an opening 709 is provided in a bottom surface 710 of the housing. The opening is in either the cap or the housing.

In FIG. 26, the bottom surface 710 includes a plurality of contact pads 712 that are isolated from each other by an encapsulant 714 or other suitable dielectric. A conductive edge 716 that is adjacent to an outer edge of the package surrounds the opening 709.

The packages and arrangements described in FIG. 19-26 may include any combination of the microphone and membrane design, as well as any arrangement of the signal processing circuitry described in this disclosure.

Figure 31:
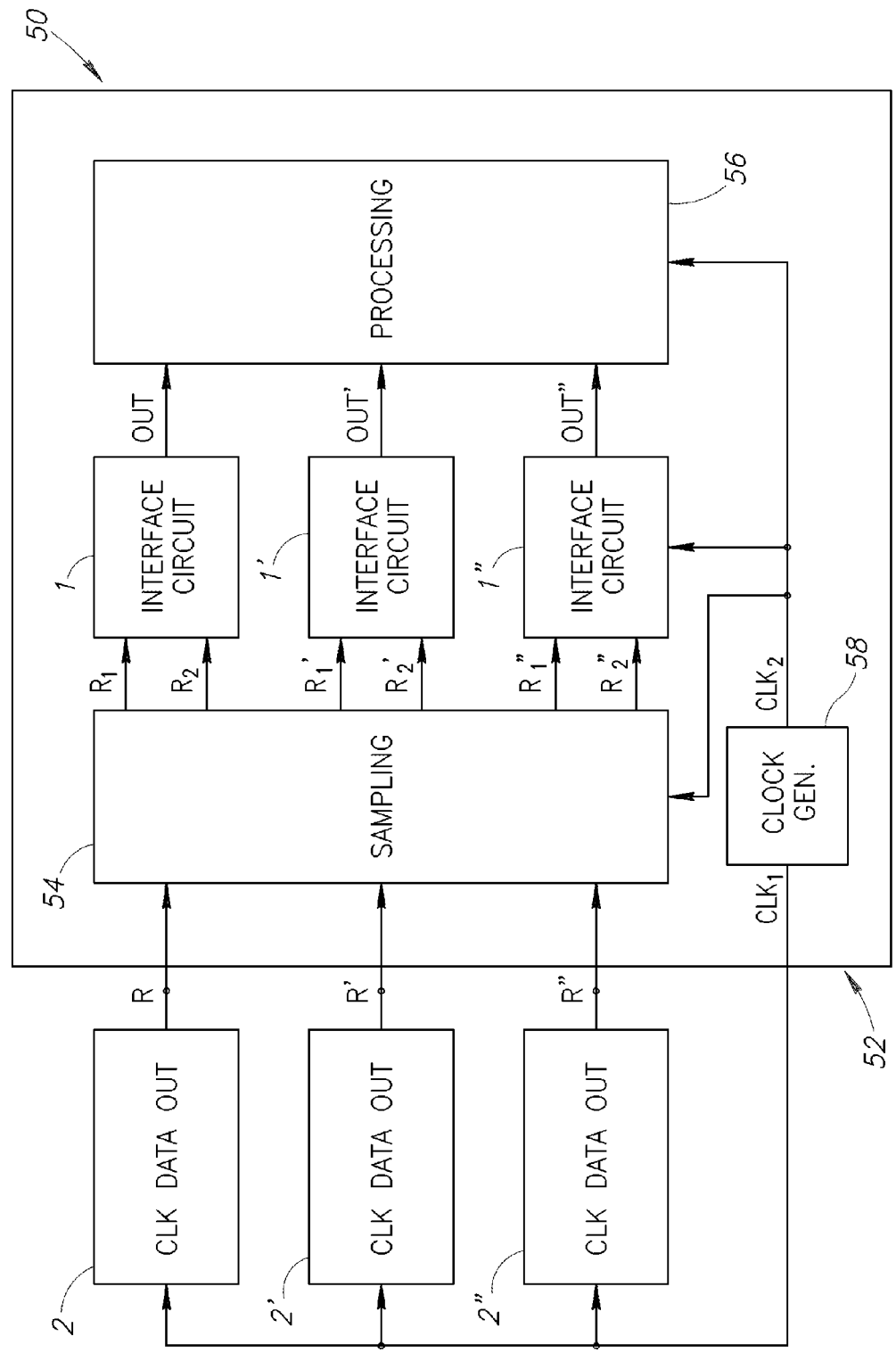
FIG. 31 is a block diagram of an acoustic transducer system, according to a further aspect of the present disclosure.

FIG. 31 shows an exemplary application the signal processing circuitry that has been described previously, referred to a microphone system, designated as a whole by 151, which comprises three acoustic transducers, designated by 2, 2' and 2", each provided with a pair of micromechanical sensing structures (here not illustrated) and each having a single digital output (here designated as DataOut), provided on which in an interlaced way are the detection signals associated to the micromechanical sensing structures, here designated by R, R' and R".

The acoustic transducers may be any one of the vibrating membrane and protecting membrane structures described in this application. In some embodiments, the three transducers may all have the same arrangement, such as the arrangement described in FIG. 7. Alternatively, the three transducers may be three distinct arrangements to have three different types of detection sensitivity in the three pairs of sensing structures.

The microphone system 151 comprises a microprocessor circuit 52, which defines: a sampling stage 54, which receives the digital signals R, R' and R" supplied by the acoustic transducers 2, 2' and 2" and generates, for each of them, the two distinct detection signals $R_1$, $R_2$; $R_1'$, $R_2'$; $R_1"$, $R_2"$ (with known de-interlacing operations); an interface circuit 1, 1' and 1", for each of the acoustic transducers 2, 2' and 2", which receives the respective pair of detection signals and supplies at output a respective output signal, Out, Out' and Out", as previously described in detail; and a digital processing stage 56, which receives the output signals Out, Out' and Out", referred to each of the acoustic transducers 2, 2' and 2", and carries out appropriate processing operations of these signals (for example, for implementing denoising algorithms).

The microprocessor circuit 52 may moreover generate internally, by means of a clock generator 58, a first clock signal $CLK_1$, which is supplied to the acoustic transducers 2, 2' and 2", on a respective clock input CLK, in such a way as to time the operations of detection of the acoustic-pressure signals; and a second clock signal $CLK_2$, having a pre-set relation with the first clock signal $CLK_1$ (for example, being phase shifted by an appropriate angle with respect thereto), which is used inside the microprocessor circuit 52, for the operations of sampling and processing of the acquired detection signals.

In particular, the recombination and processing operations are carried out at a sampling frequency that is higher, for instance sixteen times higher, than a base frequency, thus reducing the latency of the same processing operations.

In particular, the presence in the interface circuit 1 of the two distinct processing branches 100*a*, 100*b*, each of which is operatively coupled to a distinct micromechanical sensing structure and receives the corresponding digital detection signal, enables improvement of the electrical performance, in terms of dynamic range, sensitivity and signal-to-noise ratio, as compared, for example, to solutions that envisage generation of two processing paths starting from a single detection signal, of an analog type.

Use, in the interface circuit 1, of two distinct level meters (for the peak value and the root-mean-square value) enables specific advantages to be obtained in processing of the signals: in particular, the peak-level meter enables a fast response to the changes of the signal and at the same time a good measurement stability to be obtained in regard to fluctuations of the signal, thanks to the decay characteristic selectively implemented, thus ensuring timely switching in the selection of the output signal, preventing errors and possible saturation. The RMS-level meter enables a measurement to be obtained that is stable with respect to fluctuations and disturbance (for example, the so-called "glitches"), guaranteeing proper mixing of the detection signals. The output signal does not have amplitude modulations that might be perceived by the human ear (once these are reproduced acoustically).

The same realization of the peak-level meter has specific advantages in the use of a noise-gate function for filtering noise, of a decay filter for improving the measurement of the signal at low frequencies, and a watchdog function with zero crossing for reducing fluctuations and improving the measurement of the signal at high frequencies.

The presence of the low-pass filtering stage 132*a*, 132*b* in each processing branch 100*a*, 100*b* prevents any erroneous estimates of the signal level (usually estimates higher than the effective value), or in any case estimates that are not correlated with the effective value, and prevents saturation in the recombination operations.

The interface circuit 1 is moreover widely configurable, for example, as regards the choice of the lower and upper threshold values $Th_1$, $Th_2$, the adjustment of sensitivity of the processing branches by means of the adjustment factor Sens_Adj and the adjustment of the attenuation factor Norm_Att, thus enabling convenient adaptation to characteristics of various types of microphones (as shown, for example, in FIG. 31, where three acoustic transducers 2, 2', 2" are indeed advantageously used, with characteristics of sensitivity that may be even very different from one another).

Figure 32:
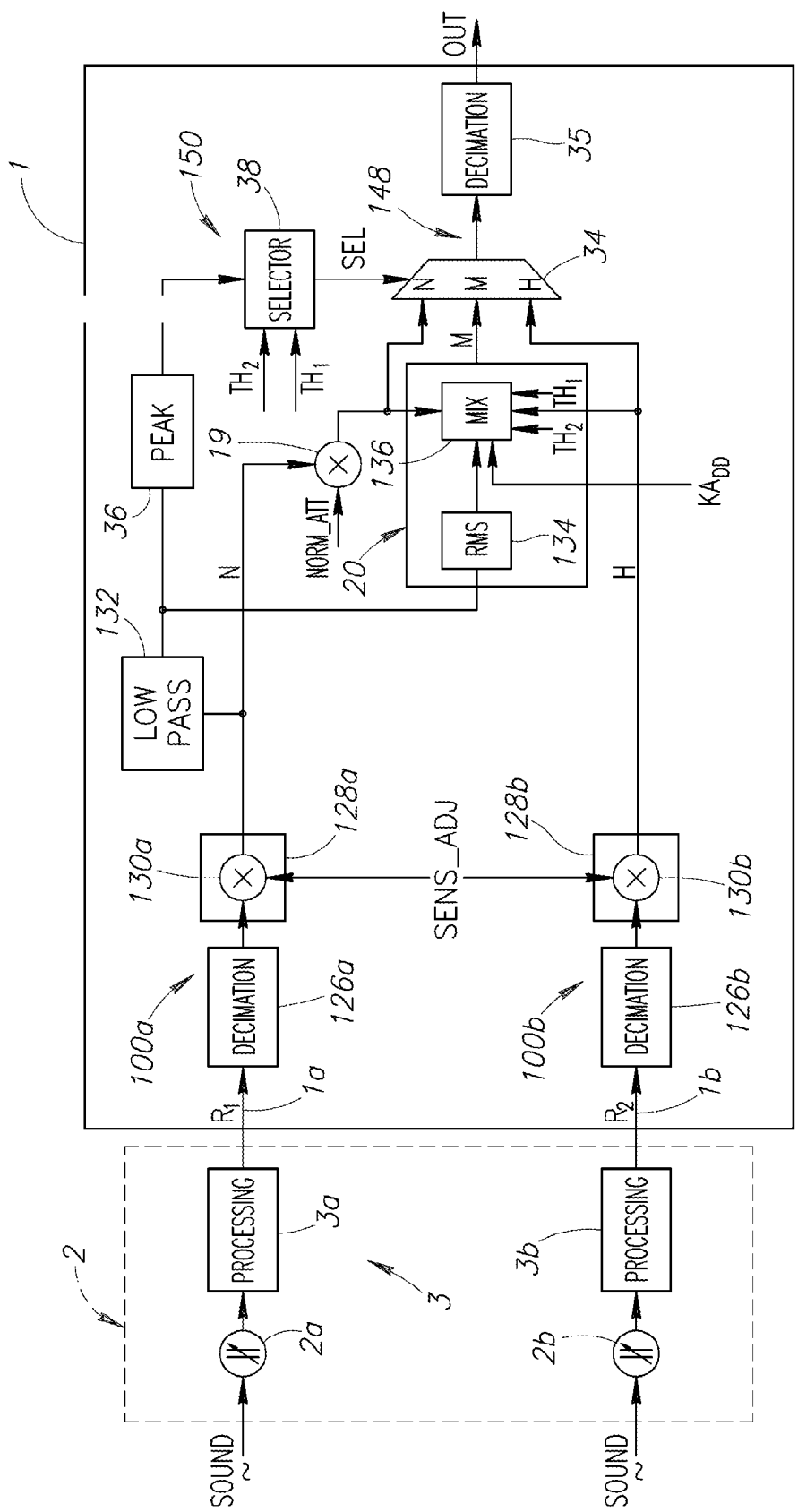
FIG. 32 is a block diagram of a digital electronic interface circuit, coupled to an acoustic transducer, according to another aspect of the present disclosure.

FIG. 32 is a block diagram of an alternative embodiment of the digital electronic interface circuit 1, coupled to the acoustic transducer 2. Better performance of the recombination stage can be obtained with alternate designs, such as the design of FIG. 32. In particular, a transition between a first detection signal N, a second detection signal H, and a mixed signal M may be made more smooth by adjusting the arrangement of components in the circuit 1.

The block diagram and circuit connection are similar in some locations to those of the embodiment of FIG. 27 described above, with some variations in the circuit connections and arrangement of some components. One variation is that the block diagram in FIG. 32 includes the RMS level meter 134 and the Peak level meter 36 connected differently and only a single low pass filter 132 is provided. In the manner described above, the output of Peak level meter 36 is one factor considered in controlling the selection between the output modes, i.e., the Peak level meter data is used to assist in selecting whether the output is only the first detection signal N, only the second detection signal H, or a mix of the first and second signals. In addition, the RMS level meter 134 is configured to control a weight of the first detection signal N and the second detection signal H during a mixed mode.

The block diagram of FIG. 32 includes the decimation blocks 126*a*, 126*b*, which are coupled to the respective adjustment blocks 128*a*, 128*b*. The adjustment blocks include the multipliers 130*a*, 130*b*. The first detection signal N is output from the multiplier 130*a* and the second detection signal is output from the multiplier 130*b*.

The low pass filtering block 132 is removed from the data path so that the signal from the first sensing structure 2*a* (first portion of a vibrating membrane) is fed directly into the second multiplier 19. The low pass filtering block 132 filters the first signal N and provides the filtered first signal to the peak or the second level measurement block 36 and the RMS circuit 134. The filtered first signal is also received by the first level-measurement block 134. The low pass and high pass filters of the second detection signal path may be removed from this embodiment.

Removing the low pass filtering block 132 from the data path avoids inclusion of phase distortion in the signal. In addition, this prevents modulations of the noise floor during transitions from the first sensing structure output signal to the second sensing structure output signal.

The RMS and Peak level meters 134, 36 respectively described above have different behaviors in that the Peak level meter 36 reacts more quickly to changes in the signals than the RMS level meter 134. As mentioned above, the Peak level meter 36 selects the mode, N only, H only, or mixed. The RMS level meter controls the weight applied to the signal N and the signal H in the mixed mode.

When the system changes between the modes, such as from only signal N to the mixed mode, it is common for the Peak and RMS level meters to have different values. In fact, in most circumstances, the Peak and RMS level meters will have different values. Because of the different values, a transition from one mode to another can create noise in the system or degrade the audio output signal.

The transition between the first detection signal N, the second detection signal H, and the mixed signal M can be less smooth, in particular from H to M, if there is a large gap between a weighted value associated with each of the signals H and M. The large gap or difference between the weighted values are related to the level-measurement or metering used to select the signal, H, N and to compute the mix M.

The circuit in FIG. 32 in conjunction with the algorithm presented below is configured to force a value of the weight before changing the output signal from signal H to signal M and from signal N to signal M. In addition, a speedup constant is summed with the weight before changing the output signal from signal M to H and from signal M to N.

More particularly, a weight is associated with the signal N and with the signal H is a given situation. For example, if a mixed signal has the signal N weighted as 95% and the signal H weighted as 5%, then a transition from the mixed signal M to only signal N would be a smooth transition. However, if the mixed signal has 50% signal N and 50% signal H, then a transition to only signal N is a much larger transition. In this case, the speedup value would be applied to the weight to smooth the transition from signal M to signal N. For example, the speedup value could move signal N to 80% and then to 100%, instead of an abrupt jump that is less likely to be a smooth transition.

The recombination output is signal H multiplied by (1-weight N) plus signal N multiplied by weight N. In the mixed mode, weight N equals (threshold H minus level_RMS N) divided by (threshold H minus threshold N). In only signal H mode, weight N equal zero. In only signal N mode, weight N equals 1. Threshold H is a maximum value of the RMS level meter. Threshold N is a minimum value of the RMS level meter.

With the circuit arrangement in FIG. 27, a sudden change from one mode to another can create a sudden transition of the signals, which may create an audible artifact between modes. For example, from signal H only to mixed and from mixed mode to signal N only. Other potential scenarios include from signal N only to signal H only or from signal H only to the mixed mode.

As mentioned above, this audible transition may be a result of the Peak level meter 36 selects a mode change when the signal N passes a decision threshold. At that point in time, the weight N has a value that depends only on the RMS level meter 134. The mixed mode signal that is being outputted may have a considerable component of the other transducer because the RMS level meter 134 may have a different value with respect to the Peak level meter 36. For example, from signal H only to mixed mode, the mixed mode output value may suddenly have a non-negligible component of signal N. As another example, if the transition is from signal N only to mixed mode, the mixed mode output value may suddenly have a non-negligible component of signal H. The noise floor of the output signal is modulated.

With respect to the elements of FIG. 32, the components provided are arranged to reduce or lessen the effect of sudden changes between modes. In particular, when transitioning from signal H only to the mixed mode signal, a value of the RMS level meter 134 is forced to a maximum value, threshold H. At a start of the mixed mode, the mixed output signal equals the signal H multiplied by (one minus zero) plus the signal N multiplied by zero, in accordance with the algorithm described above. An initial value of the mixed mode output is nearly equal to the signal H, as in the H mode. In an alternative transition, from signal N to the mixed mode, the value of the RMS level meter is formed to the minimum value, threshold N. At the start of the mixed mode, the mixed output signal equals the signal H multiplied by zero plus the signal N multiplied by one, in accordance with the algorithm described above. The initial value of the mixed mode output is nearly equal to the signal N, as in the N mode.

In yet another transition, from the mixed mode to the signal H only, a smooth transition is achieved because the weight N equals the weight N minus an adding factor. The value of weight N is zero when a certain amount of time has passed as opposed to a sudden change as in other circumstances.

In the transition from the mixed mode to signal N only, there is also a smooth transition because weight N equals weight N plus an adding factor. The value of weight N is one after a certain amount of time has passed as opposed to a sudden change as in other circumstances described above.

The adding factor is user selectable and configurable through a register or other variable feature. An embodiment for the source code for the algorithm mentioned is provided below.

```
if ((level_peak_n) < th_lin_n[i])          /* NORMAL(HSNR)
                                              CHANNEL */
{
   if(weight_n[i] >= wn_th)
   {
      weight_n[i] = 1;
      status[i] = 1;
      /* set RMS to a min value */
      level_rms_n    = rms_meter(i,th_lin_n[i],rms_tav_coeff,true);
   }
   {   weight_n[i] = weight_n[i] + wn_add; }
}
else if ((level_peak_n) > th_lin_h[i])     /* HIGH(HSPL)
                                              CHANNEL      */
{
   if (weight_n[i] < wn_add)
   {
      weight_n[i] = 0;
      status[i] = 2;
      haac_comp = 0;
      /* set RMS to a max value (th_lin_h)*/
      level_rms_n    = rms_meter(i,th_lin_h[i],rms_tav_coeff,true);
   }
   else
   {   weight_n[i] = weight_n[i] - wn_add; }
}
else                                       /* MIXED
                                              CHANNEL      */
{
   level_rms_n = rms_meter(i,input_n,rms_tav_coeff, false);
   weight_n[i] = (th_lin_h[i] - level_rms_n)*weigth_store[i];
   status[i] = 3;
}
mult = (input_signal_h * (1-weight_n[i]) +
       + input_signal_n * weight_n[i] * haac_comp);
```

The first signal N may be referred to a normal channel, where the second signal H is a high acoustic overload point channel for high amplitude audio capturing. It is noted that the membranes that output signal N and signal H likely have a different noise floor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A device, comprising:
   an acoustic transducer that includes:
      a substrate;
      a movable electrode, provided above the substrate; and a fixed electrode provided above the substrate, the fixed electrode being configured to form a capacitor with the moveable electrode and to detect a sound wave, at least one of the moveable electrode and the fixed electrode being divided into a plurality of divided electrodes, the acoustic transducer being configured to convert the sound wave into a first electrical signal and a second electrical signal and output the first and second electrical signals; and a mixing module configured to receive the first electrical signal and the second electrical signal and to output a mixed signal;

a low pass filter configured to receive the first electrical signal and configured to provide a filtered first electrical signal;

a first level measurement module configured to receive the filtered first electrical signal and to provide an output mode selection signal;

a second level measurement module configured to receive the filtered first electrical signal and to provide a weighted value to the mixing module; and an output module configured to output the first electrical signal, the second electrical signal, or the mixed signal in response to the output mode selection signal.

2. The device of claim 1 wherein the first level measurement module includes a peak detection module configured to receive the filtered first electrical signal and output the output mode selection signal.

3. The device of claim 2 wherein the first level measurement module includes a selector module configured to compare the selection signal to a first threshold and a second threshold.

4. A device, comprising:
a substrate having an opening that is configured to receive a sound wave;

a first electrode provided adjacent to the opening in the substrate, the first electrode having a main movable portion and a side movable portion that is smaller than the main movable portion, the side movable portion extending from one side of the main movable portion;

a second electrode provided adjacent to the first electrode, at least one of the first electrode and the second electrode being divided into a plurality of divided electrodes, the plurality of divided electrodes being configured to output electrical signals based on changes in capacitances between the first electrode and the second electrode in response to the sound wave; and an interface circuit configured to receive the electrical signals and configured to output one of the electrical signals or a mixed signal based on the electrical signals, the interface circuit including:

a mixing module configured to receive a first one of the electrical signals and a second one of the electrical signals and to output the mixed signal;

a low pass filter configured to receive the first one of the electrical signals and configured to provide a filtered first electrical signal;

a first level measurement module configured to receive the filtered first electrical signal and to provide an output mode selection signal;

a second level measurement module configured to receive the filtered first electrical signal and to provide a weighted value to the mixing module; and an output module configured to output the first one of the electrical signals, the second one of the electrical signals, or the mixed signal in response to the output mode selection signal.

5. The device of claim 4 wherein the first level measurement module includes a selector configured to compare the first filtered electrical signal to threshold values.

6. The device of claim 5 wherein the selector is configured to generate the selection signal to select one of the electrical signals or the mixed signal.

7. An acoustic transducer system, comprising:
a first detection structure and a second detection structure, which are separate and distinct from one another and have different characteristics of detection of acoustic-pressure waves, the first detection structure including:
a first part of a first electrode; and
a second electrode;

the second detection structure including:
a second part of the first electrode; and
the second electrode;

a digital interface circuit, coupled to the first detection structure and second detection structure, the digital interface circuit including:

first and second inputs configured to receive first and second detection signals, respectively, from the first and second detection structures, respectively;

a first digital processing path and a second digital processing path, which are coupled to the first input and the second input, respectively, and are configured to supply a first digital processed signal and a second digital processed signal, respectively;

a recombination stage configured to supply a mixed signal, via combination of the first processed signal and second processed signal with a respective weight in response to a first level value of the first processed signal; and an output stage configured to selectively supply at an output alternatively the first digital processed signal, the second digital processed signal, and the mixed signal in response to a second level value of the first processed signal.

8. The system of claim 7, further comprising:
an ASIC circuit, electrically coupled to the first detection structure and the second detection structure; wherein the digital interface circuit and the ASIC circuit are integrated in one and the same chip.

9. The system of claim 7, further comprising:
an ASIC circuit, electrically coupled to the first detection structure and the second detection structure and configured to receive and process respective electrical signals and generate an interlaced detection signal including information associated with both of the electrical signals;

the system including a sampling stage configured to receive the interlaced detection signal and configured to generate the first detection signal and the second detection signal for the digital interface circuit, each associated to a respective one of the first detection structure and the second detection structure.

10. The system of claim 7 wherein the first part of the first electrode is larger than the second part of the first electrode.

11. The system of claim 10 wherein the first part of the first electrode is rectangular and the second part of the first electrode is rectangular.

12. The system of claim 10 wherein the first part is partially separated from the second part by a thin, elongated opening.

13. The system of claim 10 wherein the first part is completely separated from the second part by a thin, elongated opening.

14. The system of claim 7 wherein the second electrode includes a first part and a second part that is separated from the first part by a dielectric.

15. The system of claim 14, further comprising a substrate, the second electrode being fixed with respect to the substrate.

16. A device, comprising:
a first membrane having a first moveable portion and a second moveable portion;
a second membrane configured to interact with the first membrane;
an audio signal processing circuit configured to receive a first audio signal and a second audio signal from the first moveable portion and the second moveable portion, respectively, the circuit including:
a first processing path configured to process the first audio signal and configured to generate a first processed signal;
a second processing path configured to process the first audio signal and configured to generate a second processed signal;
a recombination stage configured to receive the first processed signal and the second processed signal and configured to generate a mixed signal, the recombination stage including:
a first measurement module configured to receive the first processed signal and configured to generate a first measured signal;
a mixing module configured to receive the first measured signal, the second processed signal, the upper threshold value, and the lower threshold value, and configured to generate the mixed signal;
a selection stage configured to generate a selection signal based on a comparison of the first processed signal with an upper threshold value and a lower threshold value; and
a multiplexor configured to output one of the first processed signal, the second processed signal, the mixed signal based on the selection signal;
a second measurement module configured to receive the first processed signal and configured to generate a peak signal, the selection stage configured to receive the peak signal.

17. The device of claim 16 wherein the second measurement module is configured to identify a peak of the first processed signal and is configured to generate the peak signal based on the peak.

* * * * *